US012738339B2

(12) United States Patent
Lin et al.

(10) Patent No.: US 12,738,339 B2
(45) Date of Patent: Sep. 15, 2026

(54) INTEGRATED CIRCUIT AND METHOD OF OPERATING SAME

(71) Applicant: TAIWAN SEMICONDUCTOR MANUFACTURING COMPANY, LTD., Hsinchu (TW)

(72) Inventors: Yu-Wei Lin, Hsinchu (TW); Meng-Sheng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 58 days.

(21) Appl. No.: 18/514,258

(22) Filed: Nov. 20, 2023

(65) Prior Publication Data

US 2025/0054562 A1 Feb. 13, 2025

Related U.S. Application Data

(60) Provisional application No. 63/518,026, filed on Aug. 7, 2023.

(51) Int. Cl.

| | |
|---|---|
| ***G11C 7/08*** | (2006.01) |
| ***G11C 29/02*** | (2006.01) |
| ***G11C 29/52*** | (2006.01) |

(52) U.S. Cl.

CPC ................ *G11C 29/52* (2013.01); *G11C 7/08* (2013.01); *G11C 29/022* (2013.01)

(58) Field of Classification Search

CPC ......... G11C 29/52; G11C 7/08; G11C 29/022; G11C 5/025; G11C 2029/0411; G11C 29/42; G11C 7/06; G11C 29/1201; G06F 11/1044; G06F 11/102; G06F 11/1048

USPC ..................................................... 365/185.09

See application file for complete search history.

(56) References Cited

U.S. PATENT DOCUMENTS

| | | | | |
|---|---|---|---|---|
| 2010/0017663 | A1* | 1/2010 | Huang ................ | G06F 11/1008 714/711 |
| 2018/0181463 | A1* | 6/2018 | Chun .................. | G06F 11/1048 |
| 2022/0399072 | A1* | 12/2022 | Hsu ........................ | G11C 16/10 |

FOREIGN PATENT DOCUMENTS

| | | |
|---|---|---|
| KR | 10-2018-0073129 | 7/2018 |
| TW | 200402729 | 2/2004 |
| TW | 200519965 | 6/2005 |
| TW | 201203274 | 1/2012 |

* cited by examiner

*Primary Examiner* — Amir Zarabian

(74) *Attorney, Agent, or Firm* — Hauptman Ham, LLP

(57) ABSTRACT

An integrated circuit includes a first set of memory cells configured to store a first set of data, a second set of memory cells configured to store a second set of data, a first set of input output (IO) circuits coupled to the first set of memory cells, a second set of IO circuits coupled to the second set of memory cells, a first error correction code (ECC) circuit configured to store a first number of ECC bits, a second ECC circuit configured to store a second number of ECC bits; and a first ECC encoder/decoder circuit configured to correct at least a first number of errors in the first set of data and the second set of data based on the first number of ECC bits and the second number of ECC bits.

20 Claims, 20 Drawing Sheets

600A

603a4 601b1 610b 601b2
404a 603a3 608a 603a2 606a 402a 603a1
Bit-cell
ECC bit
IO <43:28> 414
IO <22:27> 618
IO <16:21> 616
IO <0:15> 412
610b2 610b1 610a2 610a1
603b4 404b 608b 603b3 603b2 606b 402b 603b1
601a1 610a 601a2

606a
ECC bit
d1
402a
Bit-cell
404a
Bit-cell
d2
608a
ECC bit

IO <0:5> 616
d1
IO<6:21> 412
IO<22:37> 414
d2
IO <22: 43> 618

606b
ECC bit
d1
402b
Bit-cell
404b
Bit-cell
d2
608b
ECC bit 606a
902a
402a
404a
902b
608a
ECC bit
Bit-cell
Bit-cell
ECC bit
IO <0:5> 616
d1
IO<6:21> 412
IO<22:37> 414
d2
IO <22: 43> 618
ECC bit
Bit-cell
Bit-cell
ECC bit
606b
904a
402b
404b
904b
608b

1400

1404 Memory
1406 Instructions
1420 Set of data
1422 Set of check bits
1424 Syndrome
1426 Set of signals
1428 User interface

1408

I/O (1410)
Processor (1402)
Network Interface (1412)
Network (1414)

1500

1502 Perform a programming operation of a first set of memory cells 1504 store a first set of data in a first memory cell array and a second set of data in a second memory cell array 1506 generate a first set of check bits in response to the first set of data and a second set of check bits in response to the second set of data 1508 store the first set of check bits in a first ECC memory cell array, and the second set of check bits in a second ECC memory cell array 1510 Perform a read operation of the first set of memory cells 1512 Read the first set of data in the first memory cell array and the second set of data in the second memory cell array 1514 Read the first set of check bits in the first ECC memory cell array, and the second set of check bits in the second ECC memory cell array 1516 Determine whether data read from the first or second memory cell array contains an error based on the first and second set of check bits?

No

1518 Idle state

Yes

1520 Correct the read data from the first or second memory cell array

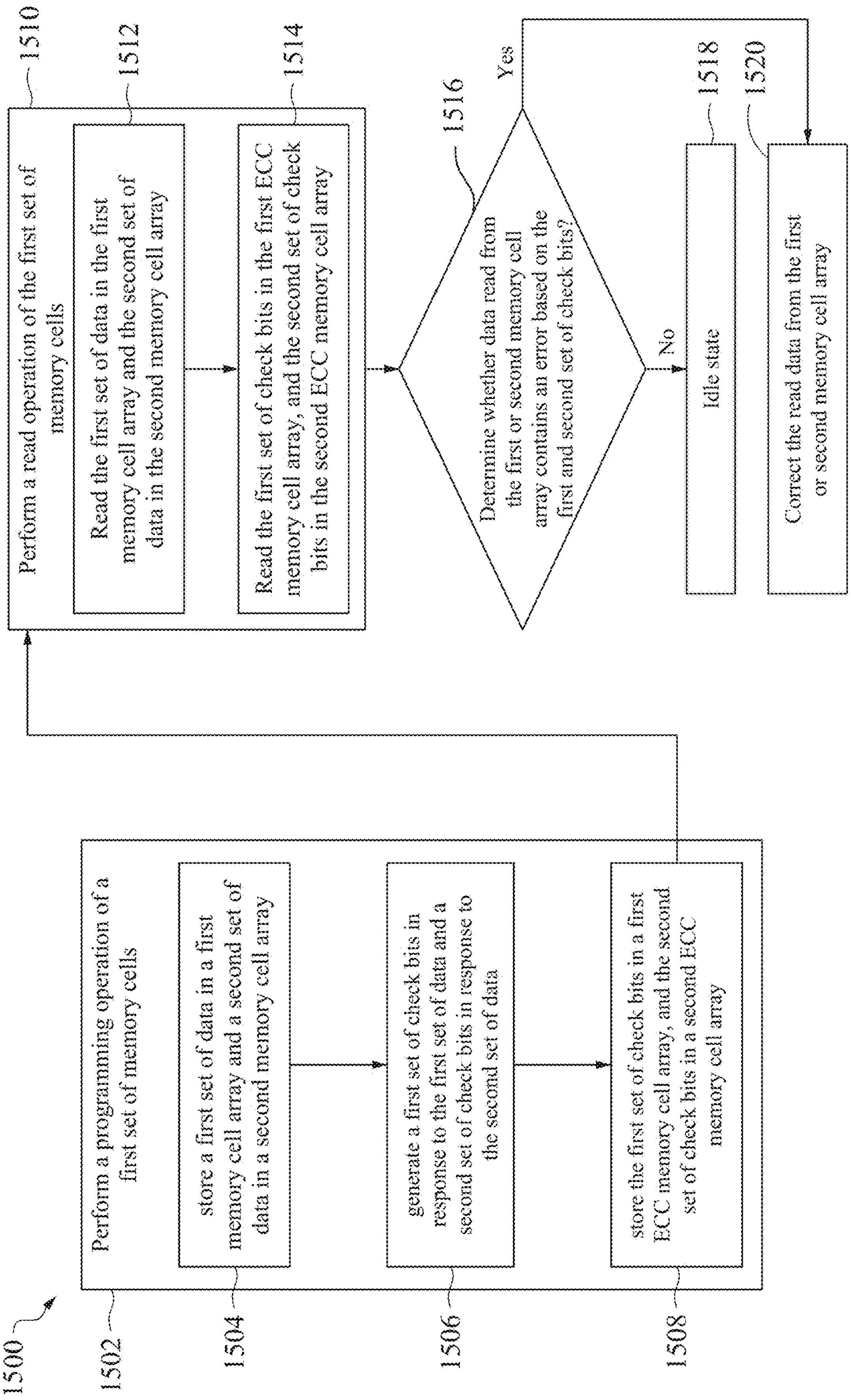

FIG. 15

INTEGRATED CIRCUIT AND METHOD OF OPERATING SAME

PRIORITY CLAIM

This application claims the benefit of U.S. Provisional Application No. 63/518,026, filed Aug. 7, 2023, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is a flowchart of a method of operating an integrated circuit, in accordance with some embodiments.

DETAILED DESCRIPTION

Figure 1:
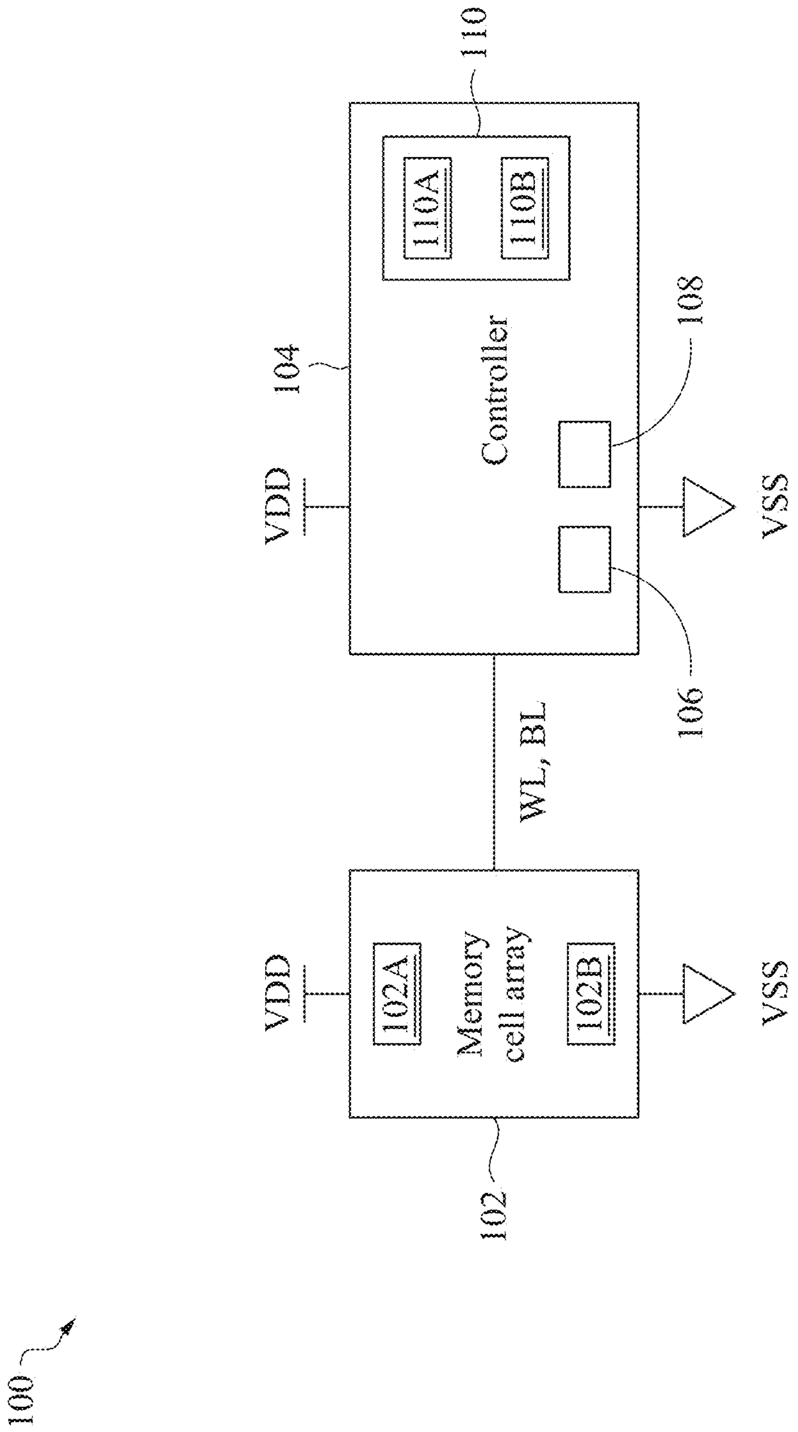
FIG. 1 is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first set of memory cells. In some embodiments, the first set of memory cells is configured to store a first set of data.

In some embodiments, the integrated circuit further includes a second set of memory cells. In some embodiments, the second set of memory cells is configured to store a second set of data.

In some embodiments, the integrated circuit further includes a first set of input output (IO) circuits. In some embodiments, the first set of IO circuits is coupled to the first set of memory cells.

In some embodiments, the integrated circuit further includes a second set of IO circuits. In some embodiments, the second set of IO circuits is coupled to the second set of memory cells.

In some embodiments, the integrated circuit further includes a first error correction code (ECC) circuit. In some embodiments, the first ECC circuit is configured to store a first number of ECC bits.

In some embodiments, the integrated circuit further includes a second ECC circuit. In some embodiments, the second ECC circuit is configured to store a second number of ECC bits.

In some embodiments, the integrated circuit further includes a first ECC encoder/decoder circuit. In some embodiments, the first ECC encoder/decoder circuit is configured to correct at least a first number of errors in the first set of data and the second set of data based on the first number of ECC bits and the second number of ECC bits.

In some embodiments, by including at least one of the first ECC encoder/decoder circuit or the second ECC encoder/decoder circuit in the integrated circuit, the integrated circuit has error correcting capability that results in improved defective parts per million (DPPM) compared to other approaches while also occupying less area than other approaches.

FIG. 1 is a block diagram of an integrated circuit 100, in accordance with some embodiments. In the embodiment of FIG. 1, integrated circuit 100 is a memory macro.

Integrated circuit 100 includes a memory cell array 102 and a controller 104. Memory cell array 102 is coupled to controller 104. In some embodiments, memory cell array 102 is coupled to controller 104 by at least bit lines BL (FIG. 2) or word lines WL or other conductive lines. Controller 104 is configured to control memory cell array 102. In some embodiments, controller 104 is configured to provide error correction encoding (ECC), decoding and correction (described below) for integrated circuit 100.

Figure 2:
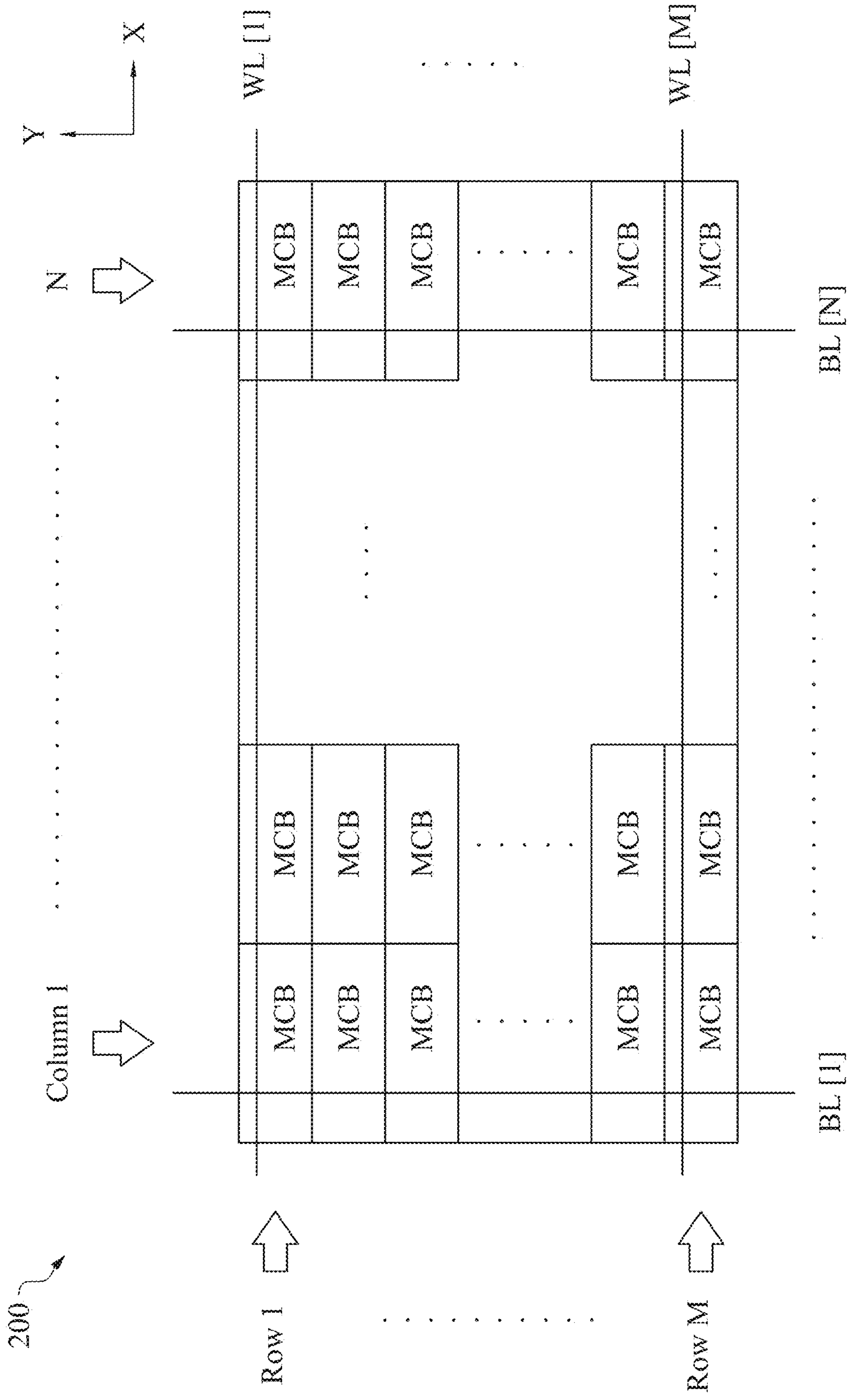
FIG. 2 is a circuit diagram of a memory circuit, in accordance with some embodiments.

Memory cell array 102 comprises an array of memory cells having M rows and N columns, where M and N are positive integers (shown in FIG. 2). In some embodiments, each memory cell in memory cell array 102 is configured to store one (1) bit of data. In some embodiments, each memory cell in memory cell array 102 is configured to store more than one (1) bit of data.

In some embodiments, memory cell array 102 is a non-volatile memory cell array including non-volatile memory cells. In some embodiments, each memory cell in memory cell array 102 corresponds to a one-time programmable (OTP) memory cell. In some embodiments, each memory cell in memory cell array 102 corresponds to an electronic fuse (eFuse) memory cell. In some embodiments, each memory cell in memory cell array 102 corresponds to a multi-time programmable (MTP) memory cell. In some embodiments, each memory cell in memory cell array 102 corresponds to a magnetoresistive random-access memory (MRAM) cell. In some embodiments, each memory cell in memory cell array 102 corresponds to a phase-change memory (PCM) cell. In some embodiments, each memory cell in memory cell array 102 corresponds to a phase-change RAM (PRAM) cell. In some embodiments, each memory cell in memory cell array 102 corresponds to a Ferroelectric RAM (FeRAM) cell. In some embodiments, each memory cell in memory cell array 102 corresponds to a Ferroelectric Field Effect Transistor (FeFET) cell.

Other types of memory cells in memory cell array 102 are within the scope of the present disclosure. Other configurations of memory cell array 102 are within the scope of the present disclosure.

In some embodiments, memory cell array 102 includes a first set of memory cells 102A and a second set of memory cells 102B. In some embodiments, the first set of memory cells 102A is a first set of memory cell arrays (e.g., memory cell array 301*a*, 301*b*, 501*a* or 501*b* as shown in at least FIGS. 3, 5 & 7A-7B). In some embodiments, the second set of memory cells 102B is a second set of memory cell arrays (e.g., memory cell array 301*a*, 301*b*, 501*a* or 501*b* as shown in at least FIGS. 3, 5 & 7A-7B). In some embodiments, the first set of memory cells 102A and the second set of memory cells 102B each include a same number of memory cells as each other. In some embodiments, the first set of memory cells 102A and the second set of memory cells 102B each include a different number of memory cells from each other.

Controller 104 includes an X-decoder circuit 106, a Y-decoder circuit 108 and an ECC encoder/decoder 110.

X-decoder circuit 106 is coupled to (not shown) memory cell array 102 by word lines WL. X-decoder circuit 106 is configured to generate word line signals (not shown) on corresponding word lines WL to memory cell array 102. In some embodiments, X-decoder circuit 106 includes word line driver circuits (not shown) coupled to the word lines WL, and the word line driver circuits (not shown) are configured to generate the word line signals that are sent to memory cell array 102.

In some embodiments, word line driver circuits (not shown) decode a row address of a memory cell in memory cell array 102 that is selected to be accessed in a read operation or a write operation. In some embodiments, the word line driver circuits (not shown) then supply a voltage to the selected word line corresponding to the decoded row address, and a different voltage to the other, unselected word lines. In some embodiments, the X-decoder circuit 106 is configured to generate the word line signals in response to a first set of control signals (not shown) received from controller 104.

Other configurations of X-decoder circuit 106 are within the scope of the present disclosure.

Y-decoder circuit 108 is coupled to (not shown) memory cell array 102 by bit lines BL. Y-decoder circuit 108 is configured to generate bit line signals (not shown) on corresponding bit lines BL to memory cell array 102.

In some embodiments, Y-decoder circuit 108 includes bit line driver circuits (not shown) coupled to the bit lines BL, and the bit line driver circuits (not shown) are configured to generate the bit line signals that are sent to memory cell array 102.

In some embodiments, bit line driver circuits (not shown) decode a column address of a memory cell in memory cell array 102 selected to be accessed in a write operation. In some embodiments, bit line driver circuits (not shown) then supply a voltage to the selected bit line corresponding to the decoded column address. In some embodiments, the Y-decoder circuit 108 is configured to generate the bit line signals in response to a second set of control signals (not shown) received from controller 104.

Other configurations of Y-decoder circuit 108 are within the scope of the present disclosure.

ECC encoder/decoder 110 is coupled to memory cell array 102 (not shown). ECC encoder/decoder 110 is configured to provide ECC encoding, decoding, error detection and error correction for data stored in memory cell array 102. In some embodiments, ECC encoder/decoder 110 includes at least one of a Hamming ECC encoder/decoder, a Hsiao ECC encoder/decoder, a Reed-Solomon ECC encoder/decoder 110, a Bose-Chaudhuri-Hocquenghem (BCH) ECC encoder/decoder 110, or the like. Other ECCs or error detection methods are within the scope of various embodiments.

In some embodiments, two or more of at least memory cell array 102, X-decoder circuit 106, Y-decoder circuit 108 or ECC encoder/decoder 110 are combined into a single circuit.

ECC encoder/decoder 110 includes a first ECC encoder/decoder 110A and a second ECC encoder/decoder 110B. The first ECC encoder/decoder 110A is coupled to the first set of memory cells 102A. The second ECC encoder/decoder 110B is coupled to the second set of memory cells 102B.

The first ECC encoder/decoder circuit 110A is configured to generate a first set of ECC check bits based on a first set of data stored in the first set of memory cells 102A.

The second ECC encoder/decoder circuit 110B is configured to generate a second number of ECC check bits based on a second set of data stored in the second set of memory cells 102B.

In some embodiments, the first ECC encoder/decoder circuit 110A and the second ECC encoder/decoder circuit 110B are configured to correct at least a first number of errors in the first set of data and the second set of data based on the first set of ECC check bits and the second set of ECC check bits. In some embodiments, the first number of errors is 1 bit. In some embodiments, the first number of errors is 2 bits. In some embodiments, the first number of errors is more than 2 bits.

In some embodiments, the first set of memory cells 102A is part of the ECC encoder/decoder 110A, and the second set of memory cells 102B is part of the ECC encoder/decoder 110B.

Other configurations of ECC encoder/decoder 110 are within the scope of the present disclosure.

Other configurations of integrated circuit 100 are within the scope of the present disclosure.

FIG. 2 is a circuit diagram of a memory circuit 200, in accordance with some embodiments.

Memory circuit 200 is an embodiment of memory cell array 102 of FIG. 1, and similar detailed description is therefore omitted.

Components that are the same or similar to those in one or more of FIGS. 1-14 are given the same reference numbers, and detailed description thereof is thus omitted.

Memory circuit 200 comprises a memory cell array 202 having M rows and N columns of memory cells MCB, where N is a positive integer corresponding to the number of columns in memory cell array 202 and M is a positive integer corresponding to the number of rows in memory cell array 202. The rows of cells in memory cell array 202 are arranged in a first direction X. The columns of cells in memory cell array 202 are arranged in a second direction Y. The second direction Y is different from the first direction X. In some embodiments, the second direction Y is perpendicular to the first direction X.

In some embodiments, each memory cell MCB in memory cell array 202 is configured to store a bit of data. In some embodiments, memory circuit 200 is logic based memory.

The number of rows M in memory cell array 202 is equal to or greater than 1. The number of columns N in memory cell array 202 is equal to or greater than 1. Different types of memory cells MCB in memory cell array 202 are within the contemplated scope of the present disclosure.

Memory circuit 200 further includes N bit lines BL[1], . . . . BL[N] (collectively referred to as "bit line BL"). Each column 1, . . . , N in memory cell array 202 is overlapped and coupled to a corresponding bit line BL[1], . . . , BL[N]. Each bit line BL extends in the second direction Y and over a column of cells (e.g., column 1, . . . , N).

Memory circuit 200 further includes M word lines WL[1], . . . . WL[M] (collectively referred to as "word line WL"). Each row 1, . . . , M in memory cell array 202 is overlapped and coupled to a corresponding word line WL[1], . . . , WL[M]. Each word line WL extends in the first direction X and over a row of cells (e.g., row 1, . . . , M).

Other configurations of memory circuit 200 are within the scope of the present disclosure. In some embodiments, one or more of bit lines BL or word lines WL are not included in memory circuit 200. In some embodiments, one or more of bit lines BL or word lines WL are replaced with a corresponding source line SL. In some embodiments, one or more source lines SL is added.

Figure 3:
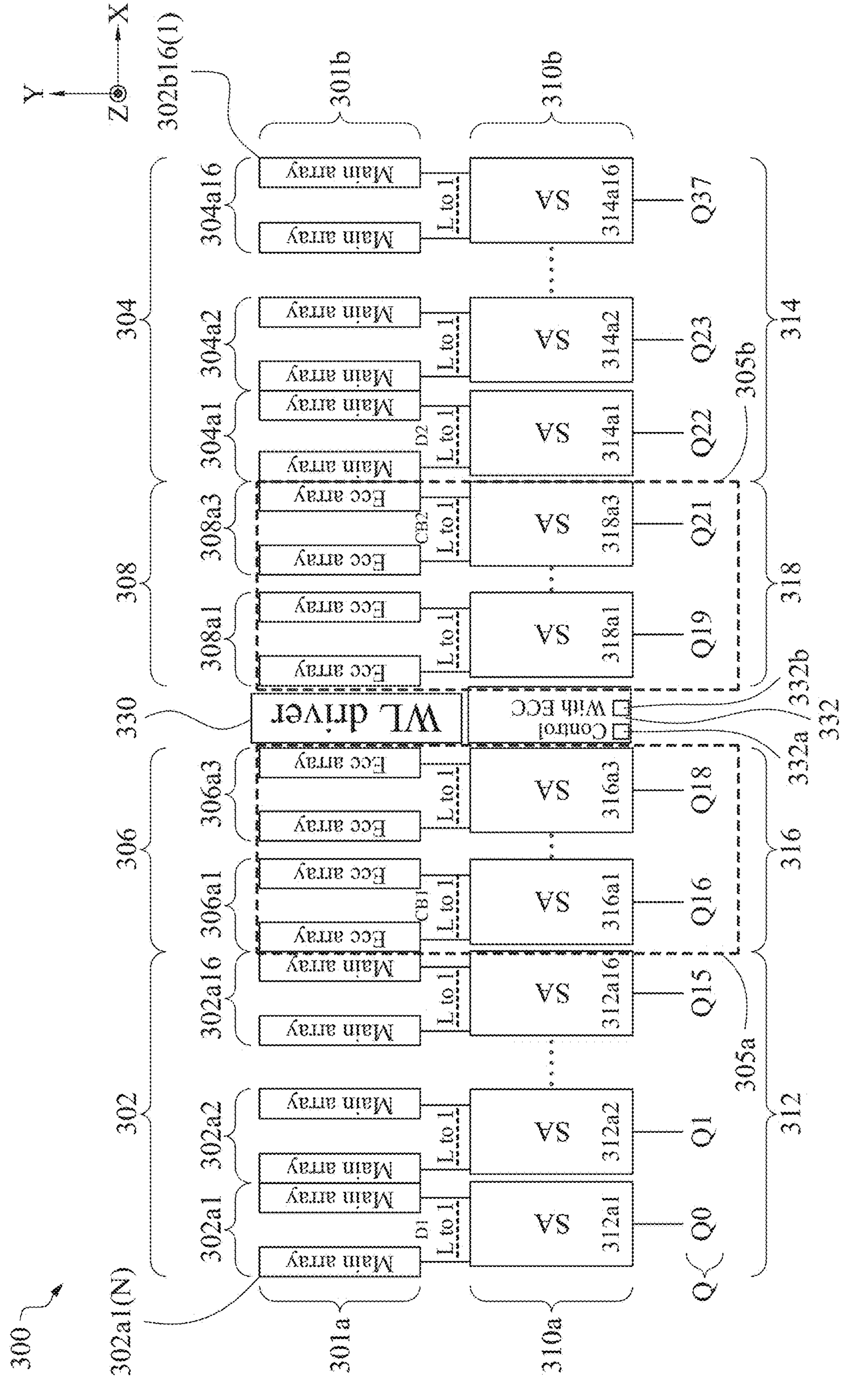
FIG. 3 is a block diagram of an integrated circuit useable in FIG. 1, in accordance with some embodiments.

FIG. 3 is a block diagram of an integrated circuit 300 usable in FIG. 1, in accordance with some embodiments.

Integrated circuit 300 relates to integrated circuit 100 of FIG. 1. Integrated circuit 300 is an embodiment of integrated circuit 100, and similar detailed description is omitted.

Integrated circuit 300 includes a set of memory cells 301*a*, a set of memory cells 301*b*, a set of input output (IO) circuits 310*a*, a set of IO circuits 310*b*, a word line driver circuit 330 and a control circuit 332.

In some embodiments, the set of memory cells 301*a* is an embodiment of the first set of memory cells 102A of FIG. 1, the set of memory cells 301*b* is an embodiment of the second set of memory cells 102B of FIG. 1, the set of IO circuits 310*a* and the set of IO circuits 310*b* is an embodiment of the X-decoder circuit 106 and the Y-decoder circuit 108 of FIG. 1, and similar detailed description is omitted.

In some embodiments, the set of memory cells 301*a* is memory circuit 200 of FIG. 2, and similar detailed description is omitted. In some embodiments, the set of memory cells 301*b* is memory circuit 200 of FIG. 2, and similar detailed description is omitted.

Memory cell array 301*a* includes a memory cell array 302 and an ECC memory cell array 306. In some embodiments, at least one of memory cell array 302 or ECC memory cell array 306 is memory circuit 200 of FIG. 2, and similar detailed description is omitted.

In some embodiments, memory cell array 302 is the same type of memory cell array as ECC memory cell array 306. In some embodiments, memory cell array 302 is a different type of memory cell array as ECC memory cell array 306.

In some embodiments, memory cell array 302 is configured to store a first set of data D1. In some embodiments, ECC memory cell array 306 is configured to store a first set of check bits CB1. The first set of ECC check bits CB1 is generated by an ECC encoder/decoder circuit 332*a* based on the first set of data D1. In some embodiments, the first set of ECC check bits CB1 is a set of even or odd parity check bits. In some embodiments, a number of check bits in the first set of ECC check bits CB1 is 3 bits. Other numbers of check bits in the first set of check bits CB1 is within the scope of the present disclosure.

In some embodiments, a number of rows or columns in memory cell array 302 is the same as a corresponding number of rows or columns in ECC memory cell array 306. In some embodiments, a number of rows or columns in memory cell array 302 is different from a corresponding number of rows or columns in ECC memory cell array 306.

Memory cell array 302 includes at least one or more of memory cell arrays 302*a*1, 302*a*2, . . . , 302*a*15 or 302*a*16. In some embodiments, each memory cell array of the memory cell arrays 302*a*1, 302*a*2, . . . , 302*a*16 includes L memory cell arrays, where L is an integer corresponding to the number of memory cell arrays in memory cell arrays 302*a*1, 302*a*2, . . . , 302*a*16. In some embodiments, L is 1 or more.

Other numbers of memory cell arrays for memory cell arrays 302*a*1, 302*a*2, . . . , 302*a*15 or 302*a*16 are within the scope of the present disclosure.

ECC memory cell array 306 includes ECC memory cell arrays 306*a*1, 306*a*2 or 306*a*3. In some embodiments, each ECC memory cell array of the ECC memory cell arrays 306*a*1, 306*a*2 or 306*a*3 includes L ECC memory cell arrays, where L is an integer corresponding to the number of ECC memory cell arrays in ECC memory cell arrays 306*a*1, 306*a*2 or 306*a*3.

Other numbers of ECC memory cell arrays for ECC memory cell arrays **306*a*1, 306*a*2 or 306*a*3** are within the scope of the present disclosure.

Memory cell array **301*b* includes a memory cell array 304 and an ECC memory cell array 308. In some embodiments, at least one of memory cell array 304 or ECC memory cell array 308 is memory circuit 200 of FIG. 2**, and similar detailed description is omitted.

In some embodiments, memory cell array 304 is the same type of memory cell array as ECC memory cell array 308. In some embodiments, memory cell array 304 is a different type of memory cell array as ECC memory cell array 308.

In some embodiments, ECC memory cell array 306 and ECC memory cell array 308 are located between memory cell array 302 and memory cell array 304. In some embodiments, the set of IO circuits 316 and the set of IO circuits 318 are located between the set of IO circuits 312 and the set of IO circuits 314.

In some embodiments, ECC memory cell array 306 and ECC memory cell array 308 are located adjacent or directly next to WL driver 330. In some embodiments, the set of IO circuits 316 and the set of IO circuits 318 are located are located adjacent or directly next to control circuit 332.

In some embodiments, memory cell array 304 is configured to store a second set of data D2. In some embodiments, ECC memory cell array 308 is configured to store a second set of check bits CB2. The second set of ECC check bits CB2 is generated by an ECC encoder/decoder circuit **332*b* based on the second set of data D2. In some embodiments, the second set of ECC check bits CB2 is a set of even or odd parity check bits. In some embodiments, a number of check bits in the second set of ECC check bits CB2 is 3 bits. Other numbers of check bits in the second set of check bits CB2** is within the scope of the present disclosure.

In some embodiments, a number of rows or columns in memory cell array 304 is the same as a corresponding number of rows or columns in memory cell array 308. In some embodiments, a number of rows or columns in memory cell array 304 is different from a corresponding number of rows or columns in memory cell array 308.

Memory cell array 304 includes at least one or more of memory cell arrays **304*a*1, 304*a*2, . . . , 304*a*15 or 304*a*16. In some embodiments, each memory cell array of the memory cell arrays 304*a*1, 304*a*2, . . . , 304*a*16 includes L memory cell arrays, where L is an integer corresponding to the number of memory cell arrays in memory cell arrays 304*a*1, 304*a*2, . . . , 304*a*16**.

Other numbers of memory cell arrays for memory cell arrays **304*a*1, 304*a*2, . . . , 304*a*16** are within the scope of the present disclosure.

ECC memory cell array 308 includes ECC memory cell arrays **308*a*1, 308*a*2 or 308*a*3. In some embodiments, each ECC memory cell array of the ECC memory cell arrays 308*a*1, 308*a*2 or 308*a*3 includes L ECC memory cell arrays, where L is an integer corresponding to the number of ECC memory cell arrays in ECC memory cell arrays 308*a*1, 308*a*2 or 308*a*3**.

Other numbers of ECC memory cell arrays for ECC memory cell arrays **308*a*1, 308*a*2 or 308*a*3** are within the scope of the present disclosure.

In some embodiments, at least one memory cell array of memory cell arrays **302*a*1, 302*a*2, . . . , 302*a*16, memory cell arrays 304*a*1, 304*a*2, . . . , 304*a*16, ECC memory cell arrays 306*a*1, 306*a*2 or 306*a*3, or ECC memory cell arrays 308*a*1, 308*a*2 or 308*a*3 corresponds to memory circuit 200 of FIG. 2**, and similar detailed description is omitted.

The set of IO circuits **310*a* is coupled to the set of memory cells 301*a* by a first set of local bit lines (not labelled). The set of IO circuits 310*b* is coupled to the set of memory cells 301*b*** by a second set of local bit lines (not labelled).

The set of IO circuits **310*a* is configured to selectively access one or more local bit lines (not labelled in FIG. 2) coupled to the set of memory cells 301*a*** based on one or more BL control signals.

The set of IO circuits **310*b* is configured to selectively access one or more local bit lines (not labelled in FIG. 2) coupled to the set of memory cells 301*b* based on one or more BL control signals. In some embodiments, the set of IO circuits 310*a* or 310*b* includes a bit line selection circuit. In some embodiments, each IO circuit of the set of IO circuits 310*a* or 310*b*** is a corresponding sense amplifier.

The set of IO circuits **310*a* includes a set of IO circuits 312 and a set of IO circuits 316**.

In some embodiments, the set of IO circuits 312 is configured to read the first set of data D1 stored in memory cell array 302. In some embodiments, the set of IO circuits 316 is configured to read the first set of check bits CB1 stored in ECC memory cell array 306.

In some embodiments, the set of IO circuits 312 is the same type of IO circuit as the set of IO circuits 316. In some embodiments, the set of IO circuits 312 is a different type of IO circuit as the set of IO circuits 316.

The set of IO circuits 312 includes at least one or more of sense amplifier circuits **312*a*1, 312*a*2, . . . , 312*a*16. In some embodiments, each sense amplifier circuit of sense amplifier circuit 312*a*1, 312*a*2, . . . , 312*a*16** is a multiple input channel sense amplifier (e.g., L-to-1).

Other numbers of sense amplifier circuits in sense amplifier circuits **312*a*1, 312*a*2, . . . , 312*a*16** are within the scope of the present disclosure.

The set of IO circuits 316 includes at least one or more of sense amplifier circuits **316*a*1, 316*a*2, or 316*a*3. In some embodiments, each sense amplifier circuit of sense amplifier circuit 316*a*1, 316*a*2, 316*a*3** is a multiple input channel sense amplifier (e.g., L-to-1).

Other numbers of sense amplifier circuits in sense amplifier circuits **316*a*1, 316*a*2 or 316*a*3** are within the scope of the present disclosure.

In some embodiments, each sense amplifier circuit of sense amplifier circuits **312*a*1, 312*a*2, . . . , 312*a*16, or sense amplifier circuits 316*a*1, 316*a*2, or 316*a*3 is coupled to a corresponding column of memory cells in the set of memory cells 301*a*** by a corresponding local bit line (not labelled).

In some embodiments, during a read operation, a sense amplifier circuit of sense amplifier circuits **312*a*1, 312*a*2, . . . , 312*a*16, or sense amplifier circuits 316*a*1, 316*a*2, or 316*a*3 is configured to read data from at least one memory cell in a corresponding column of the set of memory cells 301*a***.

Each sense amplifier circuit of sense amplifier circuit **312*a*1, 312*a*2, . . . , 312*a*16 is coupled to a corresponding memory cell array in memory cell arrays 302*a*1, 302*a*2, . . . , 302*a*15 or 302*a*16** by L corresponding local bit lines (not labelled).

Each sense amplifier circuit of sense amplifier circuits **316*a*1, 316*a*2, or 316*a*3 is coupled to a corresponding ECC memory cell array in ECC memory cell arrays 306*a*1, 306*a*2 or 306*a*3** by L corresponding local bit lines (not labelled).

In some embodiments, each sense amplifier circuit of sense amplifier circuit **312*a*1, 312*a*2, . . . , 312*a*16 is configured to output a corresponding output signal Q0, Q1, . . . , Q15 during a corresponding read operation. In some embodiments, each output signal Q0, Q1, . . . , Q15 is a corresponding data value stored in corresponding memory cell array 302*a*1, 302*a*2, . . . , 302*a*15 or 302*a*16. In some embodiments, the output signals Q0, Q1, . . . , Q15 is the first set of data D1 stored in memory cell array 302**.

In some embodiments, each sense amplifier circuit of sense amplifier circuit **316*a*1, 316*a*2 or 316*a*3 is configured to output a corresponding output signal Q16, Q17, Q18. In some embodiments, each output signal Q16, Q17, Q18 is a corresponding data value stored in corresponding ECC memory cell array 306*a*1, 306*a*2, 306*a*3. In some embodiments, each output signal Q16, Q17, Q18 is a corresponding ECC check bit of the first set of ECC check bits CB1 generated by ECC encoder/decoder circuit 332*a* based on output signal Q0, Q1, . . . , Q15. In some embodiments, the ECC encoder/decoder circuit 332*a* utilizes the first set of ECC check bits CB1 (output signal Q16, Q17, Q18) to determine if an error occurs in the output signal Q0, Q1, . . . , Q15**.

The set of IO circuits **310*b* includes a set of IO circuits 314 and a set of IO circuits 318**.

In some embodiments, the set of IO circuits 314 is configured to read the second set of data D2 stored in memory cell array 304. In some embodiments, the set of IO circuits 318 is configured to read the second set of check bits CB2 stored in ECC memory cell array 308.

In some embodiments, the set of IO circuits 314 is the same type of IO circuit as the set of IO circuits 318. In some embodiments, the set of IO circuits 314 is a different type of IO circuit as the set of IO circuits 318.

In some embodiments, at least one of the set of IO circuits 312, 314, 316 or 318 is the same type of IO circuit as another of the set of IO circuits 312, 314, 316 or 318. In some embodiments, the set of IO circuits 312, 314, 316 or 318 is a different type of IO circuit as another of the set of IO circuits 312, 314, 316 or 318.

The set of IO circuits 314 includes at least one or more of sense amplifier circuits **314*a*1, 314*a*2, . . . , 314*a*16. In some embodiments, each sense amplifier circuit of sense amplifier circuit 314*a*1, 314*a*2, . . . , 314*a*16** is a multiple input channel sense amplifier (e.g., L-to-1).

Other numbers of sense amplifier circuits in sense amplifier circuits **314*a*1, 314*a*2, . . . , 314*a*16** are within the scope of the present disclosure.

The set of IO circuits 318 includes at least one or more of sense amplifier circuits **318*a*1, 318*a*2, or 318*a*3. In some embodiments, each sense amplifier circuit of sense amplifier circuit 318*a*1, 318*a*2, 318*a*3** is a multiple input channel sense amplifier (e.g., L-to-1).

Other numbers of sense amplifier circuits in sense amplifier circuits **318*a*1, 318*a*2, or 318*a*3** are within the scope of the present disclosure.

In some embodiments, each sense amplifier circuit of sense amplifier circuits **314*a*1, 314*a*2, . . . , 314*a*16, or sense amplifier circuits 318*a*1, 318*a*2, or 318*a*3 is coupled to a corresponding column of memory cells in the set of memory cells 301*b*** by a corresponding local bit line (not labelled).

In some embodiments, during a read operation, a sense amplifier circuit of sense amplifier circuits **314*a*1, 314*a*2, . . . , 314*a*16, or sense amplifier circuits 318*a*1, 318*a*2, or 318*a*3 is configured to read data from at least one memory cell in a corresponding column of the set of memory cells 301*b***.

Each sense amplifier circuit of sense amplifier circuit **314*a*1, 314*a*2, . . . , 314*a*16 is coupled to a corresponding memory cell array in memory cell arrays 304*a*1, 304*a*2, . . . , 304*a*15 or 304*a*16** by L corresponding local bit lines (not labelled).

Each sense amplifier circuit of sense amplifier circuits **318*a*1, 318*a*2, or 318*a*3 is coupled to a corresponding ECC memory cell array in ECC memory cell arrays 308*a*1, 308*a*2 or 308*a*3** by L corresponding local bit lines (not labelled).

In some embodiments, each sense amplifier circuit of sense amplifier circuit **314*a*1, 314*a*2, . . . , 314*a*16 is configured to output a corresponding output signal Q22, Q23, . . . , Q37 during a corresponding read operation. In some embodiments, each output signal Q22, Q23, . . . , Q37 is a corresponding data value stored in corresponding memory cell array 304*a*1, 304*a*2, . . . , 304*a*15 or 304*a*16. In some embodiments, the output signals Q22, Q23, . . . , Q37 is the second set of data D2 stored in memory cell array 304**.

In some embodiments, each sense amplifier circuit of sense amplifier circuit **318*a*1, 318*a*2 or 318*a*3 is configured to output a corresponding output signal Q19, Q20, Q21. In some embodiments, each output signal Q19, Q20, Q21 is a corresponding data value stored in corresponding ECC memory cell array 308*a*1, 308*a*2, 308*a*3. In some embodiments, each output signal Q19, Q20, Q21 is a corresponding ECC check bit of the second set of ECC check bits CB2 generated by ECC encoder/decoder circuit 332*b* based on output signal Q22, Q23, . . . , Q37. In some embodiments, the ECC encoder/decoder circuit 332*b* utilizes the second set of ECC check bits CB2 (e.g., output signal Q19, Q20, Q21) to determine if an error occurs in the output signal Q22, Q23, . . . , Q37**.

In some embodiments, integrated circuit 300 includes 38 IO circuits (e.g., set of IO circuits **310*a* and 310*b*), and integrated circuit 300 is configured to output 38 bits as the output signal Q (e.g, output signal Q0-Q37**).

In some embodiments, integrated circuit 300 is configured to correct at least a first number of errors in the first set of data D1 and the second set of data D2 based on the first set of ECC check bits CB1 and the second set of ECC check bits CB2. In some embodiments, the first number of errors is 1 bit. In some embodiments, the first number of errors is 2 bits. In some embodiments, the first number of errors is more than 2 bits. Other number of errors for the first number of errors are within the scope of the present disclosure.

Other numbers of output signals, IO circuits or bits as the output signal Q are within the scope of the present disclosure.

In some embodiments, ECC memory cell array 306 and the set of IO circuits 316 are referred to as an ECC circuit **305*a***.

In some embodiments, ECC memory cell array 308 and the set of IO circuits 318 are referred to as an ECC circuit **305*b***.

In some embodiments, ECC memory cell array 306 of ECC circuit **305*a* is configured to store the first set of ECC check bits CB1, and the set of IO circuits 316 of ECC circuit 305*a* are configured to read the first set of ECC check bits CB1 from the ECC memory cell array 306 of ECC circuit 305*b***.

In some embodiments, ECC memory cell array 308 of ECC circuit **305*b* is configured to store the second set of ECC check bits CB2, and the set of IO circuits 318 of ECC circuit 305*b* are configured to read the second set of ECC check bits CB2 from the ECC memory cell array 308 of ECC circuit 305*b***.

The word line driver circuit 330 is configured to generate word line signals on corresponding word lines WL. In some embodiments, each word line driver circuit 330 is configured to output word line signals on corresponding word lines WL to adjacent memory cells in the set of memory cells 301*a* or 301*b*.

Each control circuit 332 is an electronic circuit configured to receive one or more address signals. Each control circuit 332 is configured to generate signals corresponding to adjacent subsets of memory cells identified by the one or more address signals. In some embodiments, the adjacent subsets of memory cells correspond to columns of memory cells. In some embodiments, each control circuit 332 is configured to generate each signal as a complementary pair of signals. In some embodiments, each control circuit 332 is configured to output the signals to corresponding word line driver circuits within the adjacent word line driver circuit 330.

In some embodiments, the word line driver circuit 330 is between ECC memory cell array 306 and ECC memory cell array 308. In some embodiments, the control circuit 332 is between the set of IO circuits 318 and the set of IO circuits 316.

The control circuit 332 includes the ECC encoder/decoder circuit 332*a* and the ECC encoder/decoder circuit 332*b*.

ECC encoder/decoder circuit 332*a* is configured to generate the first set of ECC check bits CB1 based on the first set of data D1.

ECC encoder/decoder circuit 332*b* is configured to generate the second number of ECC check bits CB2 based on the second set of data D2.

The ECC encoder/decoder circuit 332*a* and the ECC encoder/decoder circuit 332*b* are configured to correct at least the first number of errors in the first set of data D1 and the second set of data D2 based on the first set of ECC check bits CB1 and the second set of ECC check bits CB2.

In some embodiments, the ECC encoder/decoder circuits 332*a* and 332*b* are configured to correct at least the first number of errors in output signal Q0, Q1, . . . , Q15 and output signal Q22, Q23, . . . , Q37 based on output signal Q16, Q17, Q18 and output signal Q19, Q20, Q21.

In some embodiments, by including at least one of ECC encoder/decoder circuits 332*a* and 332*b*, ECC circuit 305*a* or ECC circuit 305*b* in integrated circuit 300, integrated circuit 300 has error correcting capability that results in improved defective parts per million (DPPM) compared to other approaches while also occupying less area than other approaches.

In some embodiments, by including at least one of ECC encoder/decoder circuits 332*a* and 332*b*, ECC circuit 305*a* or ECC circuit 305*b* in integrated circuit 300, integrated circuit 300 has error correcting capability that results in improved DPPM compared to other approaches while having more area efficiency than other approaches.

Other configurations of integrated circuit 300 are within the scope of the present disclosure.

Figure 4A:
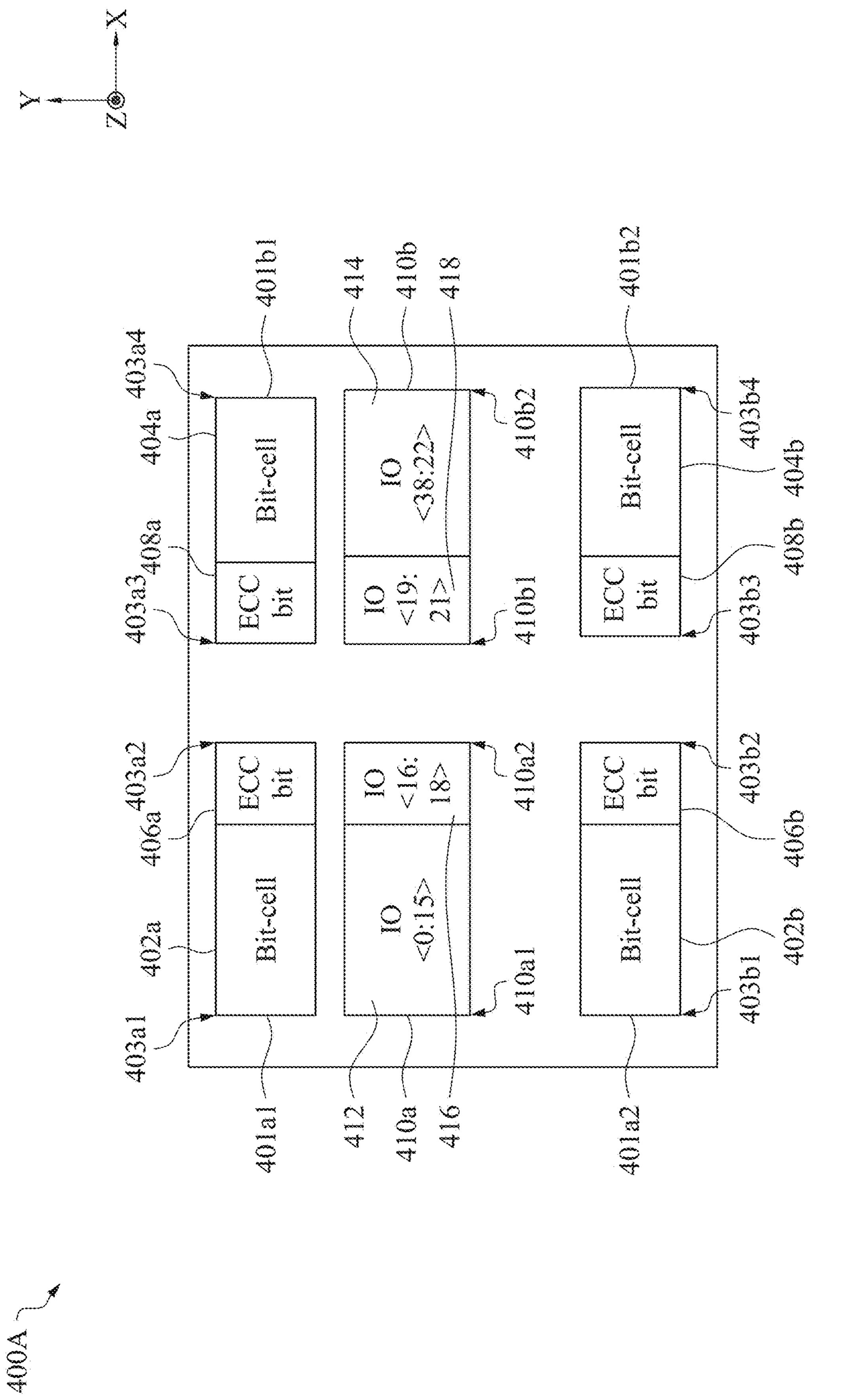
FIG. 4A is a top view of an integrated circuit, in accordance with some embodiments.

FIG. 4A is a top view of an integrated circuit 400A, in accordance with some embodiments.

Integrated circuit 400A is an embodiment of a portion of integrated circuit 300, and similar detailed description is therefore omitted. For example, integrated circuit 400A is an embodiment of a portion of integrated circuit 300 where the first set of ECC check bits CB1 are located on an inner portion (e.g., side 403*a*2 or 403*b*2) of memory cell array 401*a*1 or 401*a*2, and the second set of ECC check bits CB2 are located on an inner portion (e.g., side 403*a*3 or 403*b*3) of memory cell array 401*b*1 or 401*b*2, and similar detailed description is therefore omitted.

In some embodiments, FIG. 4A is a layout of a portion of integrated circuit 400A.

Integrated circuit 400A includes a memory cell array 401*a*1, a memory cell array 401*a*2, a memory cell array 401*b*1, a memory cell array 401*b*2, a set of IO circuits 410*a* and a set of IO circuits 410*b*.

In some embodiments, memory cell array 401*a*1 and memory cell array 401*a*2 are corresponding upper banks and lower banks of memory cell array 301*a* of FIG. 3, and similar detailed description is omitted.

In some embodiments, memory cell array 401*b*1 and memory cell array 401*b*2 are corresponding upper banks and lower banks of memory cell array 301*b* of FIG. 3, and similar detailed description is omitted.

In some embodiments, the set of IO circuits 410*a* is the set of IO circuits 310*a* of FIG. 3, and similar detailed description is omitted. In some embodiments, the set of IO circuits 410*b* is the set of IO circuits 310*b* of FIG. 3, and similar detailed description is omitted.

Memory cell array 401*a*1 includes a memory cell array 402*a* and an ECC memory cell array 406*a*.

Memory cell array 402*a* is configured to store the first set of data D1. ECC memory cell array 406*a* is configured to store the first set of check bits CB1.

In some embodiments, memory cell array 402*a* is an upper bank of memory cell array 302 of FIG. 3, and similar detailed description is omitted. In some embodiments, ECC memory cell array 406*a* is an upper bank of ECC memory cell array 306 of FIG. 3, and similar detailed description is omitted.

Memory cell array 401*a*1 further includes a first end 403*a*1 and a second end 403*a*2 opposite from the first end 403*a*1.

Memory cell array 402*a* is located on the first end 403*a*1 of memory cell array 401*a*1. ECC memory cell array 406*a* is located on the second end 403*a*2 of memory cell array 401*a*1.

Memory cell array 401*a*2 includes a memory cell array 402*b* and an ECC memory cell array 406*b*.

Memory cell array 402*b* is configured to store the first set of data D1. ECC memory cell array 406*b* is configured to store the first set of check bits CB1.

In some embodiments, memory cell array 402*b* is a lower bank of memory cell array 302 of FIG. 3, and similar detailed description is omitted. In some embodiments, ECC memory cell array 406*b* is a lower bank of ECC memory cell array 306 of FIG. 3, and similar detailed description is omitted.

Memory cell array 401*a*2 further includes a first end 403*b*1 and a second end 403*b*2 opposite from the first end 403*b*1.

Memory cell array 402*b* is located on the first end 403*b*1 of memory cell array 401*a*2. ECC memory cell array 406*b* is located on the second end 403*b*2 of memory cell array 401*a*2.

Memory cell array 401*b*1 includes a memory cell array 404*a* and an ECC memory cell array 408*a*.

Memory cell array 404*a* is configured to store the second set of data D2. ECC memory cell array 408*a* is configured to store the second set of check bits CB2.

In some embodiments, memory cell array 404*a* is an upper bank of memory cell array 304 of FIG. 3, and similar detailed description is omitted. In some embodiments, ECC memory cell array 408*a* is an upper bank of ECC memory cell array 308 of FIG. 3, and similar detailed description is omitted.

Memory cell array 401*b*1 further includes a first end 403*a*3 and a second end 403*a*4 opposite from the first end 403*a*3.

Memory cell array 404*a* is located on the second end 403*a*4 of memory cell array 401*b*1. ECC memory cell array 408*a* is located on the first end 403*a*3 of memory cell array 401*b*1.

Memory cell array 401*b*2 includes a memory cell array 404*b* and an ECC memory cell array 408*b*.

Memory cell array 404*b* is configured to store the second set of data D2. ECC memory cell array 408*b* is configured to store the second set of check bits CB2.

In some embodiments, memory cell array 404*b* is a lower bank of memory cell array 304 of FIG. 3, and similar detailed description is omitted. In some embodiments, ECC memory cell array 408*b* is a lower bank of ECC memory cell array 308 of FIG. 3, and similar detailed description is omitted.

Memory cell array 401*b*2 further includes a first end 403*b*3 and a second end 403*b*4 opposite from the first end 403*b*3.

Memory cell array 404*b* is located on the second end 403*b*4 of memory cell array 401*b*2. ECC memory cell array 408*b* is located on the first end 403*b*3 of memory cell array 401*b*2.

The set of IO circuits 410*a* includes a set of sense amplifier circuits 412 and a set of sense amplifier circuits 416.

In some embodiments, the set of sense amplifier circuits 412 is sense amplifier circuits 312*a*1, 312*a*2, . . . , 312*a*16 of FIG. 3, and similar detailed description is omitted.

In some embodiments, the set of sense amplifier circuits 416 is sense amplifier circuits 316*a*1, 316*a*2, 316*a*3 of FIG. 3, and similar detailed description is omitted.

The set of IO circuits 410*a* further includes a first end 410*a*1 and a second end 410*a*2 opposite from the first end 410*a*1.

The set of sense amplifier circuits 412 is located on the first end 410*a*1 of the set of IO circuits 410*a*. The set of sense amplifier circuits 416 is located on the second end 410*a*2 of the set of IO circuits 410*a*.

The set of IO circuits 410*b* includes a set of sense amplifier circuits 414 and a set of sense amplifier circuits 418.

In some embodiments, the set of sense amplifier circuits 414 is sense amplifier circuits 314*a*1, 314*a*2, . . . , 314*a*16 of FIG. 3, and similar detailed description is omitted.

In some embodiments, the set of sense amplifier circuits 418 is sense amplifier circuits 318*a*1, 318*a*2, 318*a*3 of FIG. 3, and similar detailed description is omitted.

The set of IO circuits 410*b* further includes a first end 410*b*1 and a second end 410*b*2 opposite from the first end 410*b*1.

The set of sense amplifier circuits 414 is located on the second end 410*b*2 of the set of IO circuits 410*b*. The set of sense amplifier circuits 418 is located on the first end 410*b*1 of the set of IO circuits 410*b*.

Integrated circuit 400A achieves the benefits discussed herein.

Other configurations of integrated circuit 400A are within the scope of the present disclosure.

Figure 4B:
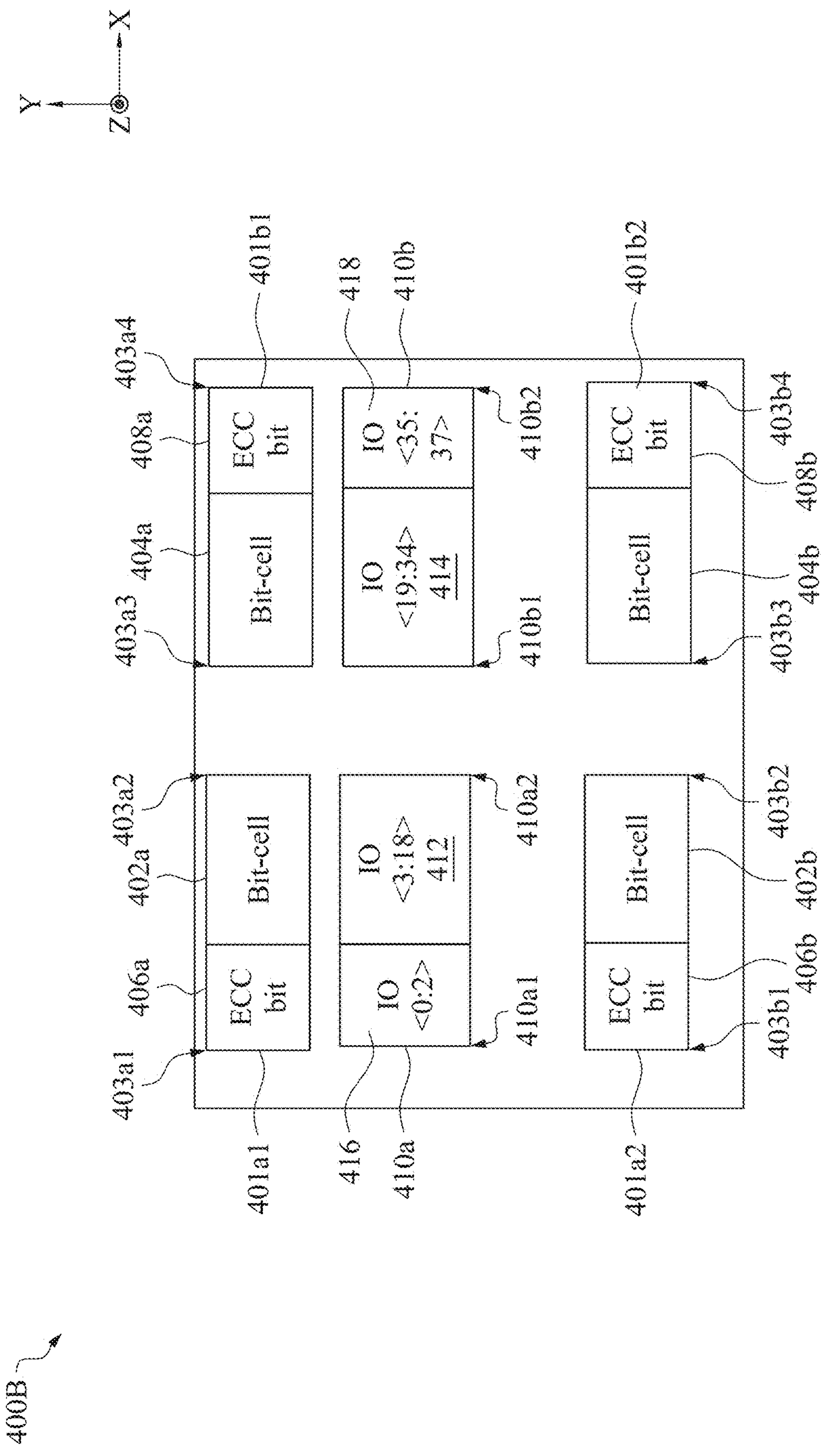
FIG. 4B is a top view of an integrated circuit, in accordance with some embodiments.

FIG. 4B is a top view of an integrated circuit 400B, in accordance with some embodiments.

Integrated circuit 400B is an embodiment of a portion of integrated circuit 300, and similar detailed description is therefore omitted.

Integrated circuit 400B is a variation of integrated circuit 400A of FIG. 4A, and similar detailed description is omitted. In comparison with integrated circuit 400A of FIG. 4A, the first set of ECC check bits CB1 are located on an outer portion (e.g., side 403*a*1 or 403*b*1) of memory cell array 401*a*1 or 401*a*2, and the second set of ECC check bits CB2 are located on an outer portion (e.g., side 403*a*4 or 403*b*4) of memory cell array 401*b*1 or 401*b*2, and similar detailed description is therefore omitted.

In some embodiments, FIG. 4A is a layout of a portion of integrated circuit 400A.

Memory cell array 402*a* is located on the second end 403*a*2 of memory cell array 401*a*1. ECC memory cell array 406*a* is located on the first end 403*a*1 of memory cell array 401*a*1.

Memory cell array 402*b* is located on the second end 403*b*2 of memory cell array 401*a*2. ECC memory cell array 406*b* is located on the first end 403*b*1 of memory cell array 401*a*2.

Memory cell array 404*a* is located on the first end 403*a*3 of memory cell array 401*b*1. ECC memory cell array 408*a* is located on the second end 403*a*4 of memory cell array 401*b*1.

Memory cell array 404*b* is located on the first end 403*b*3 of memory cell array 401*b*2. ECC memory cell array 408*b* is located on the second end 403*b*4 of memory cell array 401*b*2.

The set of sense amplifier circuits 412 is located on the second end 410*a*2 of the set of IO circuits 410*a*. The set of sense amplifier circuits 416 is located on the first end 410*a*1 of the set of IO circuits 410*a*.

The set of sense amplifier circuits 414 is located on the first end 410*b*1 of the set of IO circuits 410*b*. The set of sense amplifier circuits 418 is located on the second end 410*b*2 of the set of IO circuits 410*b*.

Integrated circuit 400B achieves the benefits discussed herein.

Other configurations of integrated circuit 400B are within the scope of the present disclosure.

Figure 5:
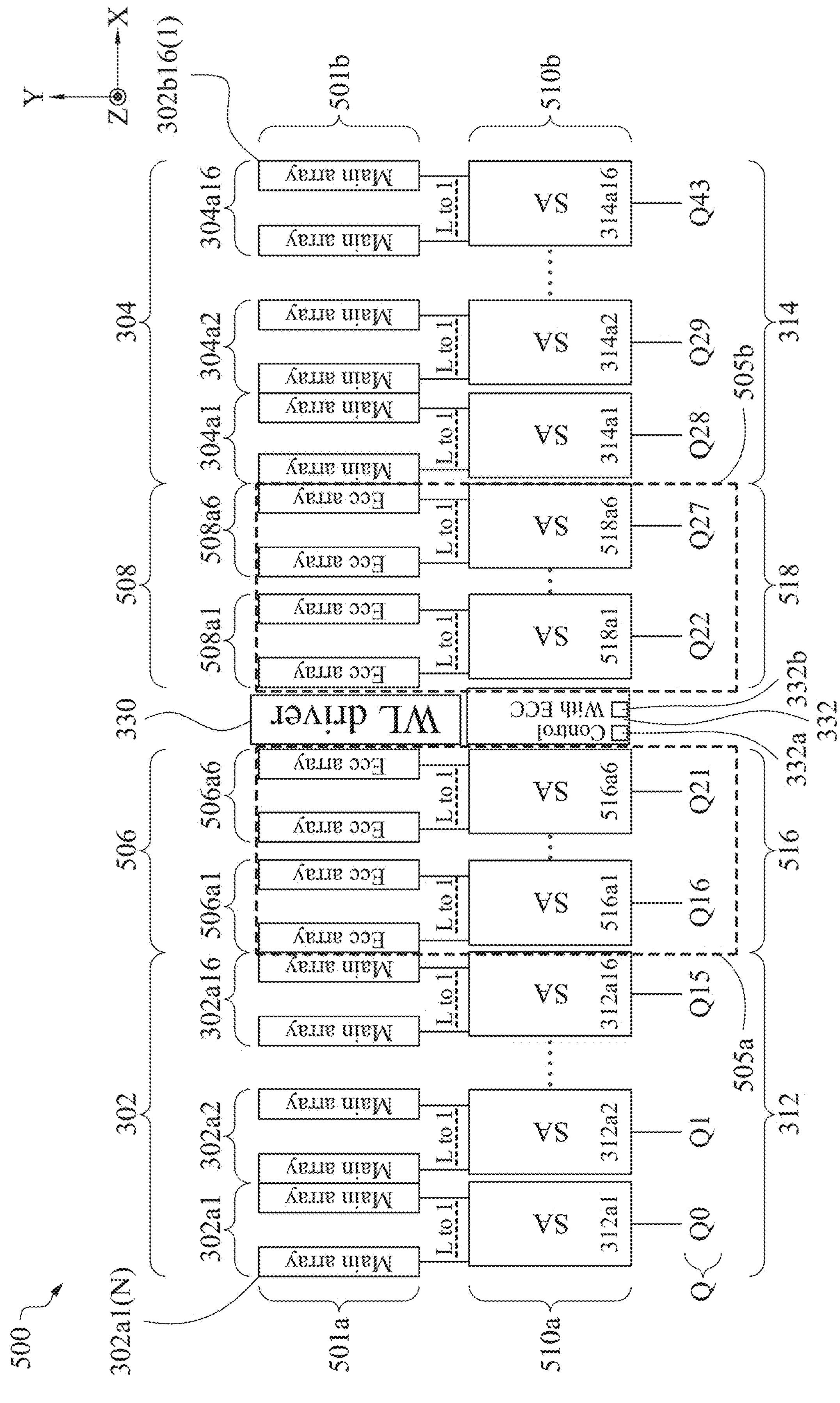
FIG. 5 is a block diagram of an integrated circuit 500 usable in FIG. 1, in accordance with some embodiments.

FIG. 5 is a block diagram of an integrated circuit 500 usable in FIG. 1, in accordance with some embodiments.

Integrated circuit 500 relates to integrated circuit 100 of FIG. 1. Integrated circuit 500 is an embodiment of integrated circuit 100, and similar detailed description is omitted.

Integrated circuit 500 is a variation of integrated circuit 300 of FIG. 3, and similar detailed description is omitted.

In comparison with integrated circuit 300 of FIG. 3, integrated circuit 500 is configured to use 12 bits for ECC protection of the output signal Q, in accordance with some embodiments.

In comparison with integrated circuit 300 of FIG. 3, integrated circuit 500 is configured to output the output signal Q, and the output signal Q includes 44 bits, in accordance with some embodiments.

Integrated circuit 500 includes a set of memory cells 501*a*, a set of memory cells 501*b*, a set of IO circuits 510*a*, a set of IO circuits 510*b*, the word line driver circuit 330 and the control circuit 332.

In comparison with integrated circuit 300 of FIG. 3, the set of memory cells 501*a* replaces set of memory cells 301*a*, and the set of memory cells 501*b* replaces set of memory cells 301*b*, and similar detailed description is therefore omitted.

In comparison with integrated circuit 300 of FIG. 3, the set of IO circuits 510*a* replaces set of IO circuits 310*a*, and the set of IO circuits 510*b* replaces set of IO circuits 310*b*, and similar detailed description is therefore omitted.

Memory cell array 501*a* includes memory cell array 302 and an ECC memory cell array 506.

ECC memory cell array 506 is a variation of ECC memory cell array 306 of FIG. 3, and similar detailed description is omitted.

In some embodiments, ECC memory cell array 506 is configured to store a third set of check bits CB3. The third set of ECC check bits CB3 is generated by ECC encoder/decoder circuit 332*a* based on the first set of data D1. In some embodiments, the third set of ECC check bits CB3 is a set of even or odd parity check bits. In some embodiments, a number of check bits in the third set of ECC check bits CB3 is 6 bits. Other numbers of check bits in the third set of check bits CB3 is within the scope of the present disclosure.

ECC memory cell array 506 includes ECC memory cell arrays 506*a*1, 506*a*2, 506*a*3, 506*a*4, 506*a*5 or 506*a*6. In some embodiments, each ECC memory cell array of the ECC memory cell arrays 506*a*1, 506*a*2, 506*a*3, 506*a*4, 506*a*5 or 506*a*6 is similar to one or more of ECC memory cell arrays 306*a*1, 306*a*2 or 306*a*3, and similar detailed description is omitted.

In some embodiments, each ECC memory cell array of the ECC memory cell arrays 506*a*1, 506*a*2, 506*a*3, 506*a*4, 506*a*5 or 506*a*6 includes L ECC memory cell arrays, where L is an integer corresponding to the number of ECC memory cell arrays in ECC memory cell arrays 506*a*1, 506*a*2, 506*a*3, 506*a*4, 506*a*5 or 506*a*6.

Other numbers of ECC memory cell arrays for ECC memory cell arrays 506*a*1, 506*a*2, 506*a*3, 506*a*4, 506*a*5 or 506*a*6 are within the scope of the present disclosure.

Memory cell array 501*b* includes memory cell array 304 and an ECC memory cell array 508.

ECC memory cell array 508 is a variation of ECC memory cell array 308 of FIG. 3, and similar detailed description is omitted.

In some embodiments, ECC memory cell array 508 is configured to store a third set of check bits CB3. The third set of ECC check bits CB3 is generated by ECC encoder/decoder circuit 332*b* based on the second set of data D2. In some embodiments, the third set of ECC check bits CB3 is a set of even or odd parity check bits. In some embodiments, a number of check bits in the fourth set of ECC check bits CB4 is 6 bits. Other numbers of check bits in the fourth set of check bits CB4 is within the scope of the present disclosure.

ECC memory cell array 508 includes ECC memory cell arrays 508*a*1, 508*a*2, 508*a*3, 508*a*4, 508*a*5 or 508*a*6. In some embodiments, each ECC memory cell array of the ECC memory cell arrays 508*a*1, 508*a*2, 508*a*3, 508*a*4, 508*a*5 or 508*a*6 is similar to one or more of ECC memory cell arrays 308*a*1, 308*a*2 or 308*a*3, and similar detailed description is omitted.

In some embodiments, each ECC memory cell array of the ECC memory cell arrays 508*a*1, 508*a*2, 508*a*3, 508*a*4, 508*a*5 or 508*a*6 includes L ECC memory cell arrays, where L is an integer corresponding to the number of ECC memory cell arrays in ECC memory cell arrays 508*a*1, 508*a*2, 508*a*3, 508*a*4, 508*a*5 or 508*a*6.

Other numbers of ECC memory cell arrays for ECC memory cell arrays 508*a*1, 508*a*2, 508*a*3, 508*a*4, 508*a*5 or 508*a*6 are within the scope of the present disclosure.

The set of IO circuits 510*a* includes the set of IO circuits 312 and a set of IO circuits 516.

The set of IO circuits 516 is a variation of the set of IO circuits 316 of FIG. 3, and similar detailed description is omitted.

In some embodiments, the set of IO circuits 516 is configured to read the third set of check bits CB3 stored in ECC memory cell array 506.

The set of IO circuits 516 includes at least one or more of sense amplifier circuits 516*a*1, 516*a*2, 516*a*3, 516*a*4, 516*a*5, or 516*a*6. In some embodiments, each sense amplifier circuit of sense amplifier circuit 516*a*1, 516*a*2, 516*a*3, 516*a*4, 516*a*5, or 516*a*6 is a multiple input channel sense amplifier (e.g., L-to-1).

Other numbers of sense amplifier circuits in sense amplifier circuits 516*a*1, 516*a*2 516*a*3, 516*a*4, 516*a*5, or 516*a*6 are within the scope of the present disclosure.

Each sense amplifier circuit of sense amplifier circuits 516*a*1, 516*a*2, 516*a*3, 516*a*4, 516*a*5 or 516*a*6 is coupled to a corresponding ECC memory cell array in ECC memory cell arrays 506*a*1, 506*a*2, 506*a*3, 506*a*4, 506*a*5 or 506*a*6 by L corresponding local bit lines (not labelled).

In some embodiments, each sense amplifier circuit of sense amplifier circuit 312*a*1, 312*a*2, . . . , 312*a*16 is configured to output a corresponding output signal Q0, Q1, . . . , Q15 during a corresponding read operation. In some embodiments, each output signal Q0, Q1, . . . , Q15 is a corresponding data value stored in corresponding memory cell array 302*a*1, 302*a*2, . . . , 302*a*15 or 302*a*16. In some embodiments, the output signals Q0, Q1, . . . , Q15 is the first set of data D1 stored in memory cell array 302.

In some embodiments, each sense amplifier circuit of sense amplifier circuit 516*a*1, 516*a*2, 516*a*3, 516*a*4, 516*a*5 or 516*a*6 is configured to output a corresponding output signal Q16, Q17, Q18, Q19, Q20 or Q21. In some embodiments, each output signal Q16, Q17, Q18, Q19, Q20, Q21 is a corresponding data value stored in corresponding ECC memory cell array 506*a*1, 506*a*2, 506*a*3, 506*a*4, 506*a*5, 506*a*6. In some embodiments, each output signal Q16, Q17, Q18, Q19, Q20, Q21 is a corresponding ECC check bit of the third set of ECC check bits CB3 generated by ECC encoder/decoder circuit 332*a* based on output signal Q0, Q1, . . . , Q15. In some embodiments, the ECC encoder/decoder circuit 332*a* utilizes the third set of ECC check bits CB3 (output signal Q16, Q17, Q18, Q19, Q20, Q21) to determine if an error occurs in the output signal Q0, Q1, . . . , Q15.

The set of IO circuits 510*b* includes the set of IO circuits 314 and a set of IO circuits 518.

The set of IO circuits 518 is a variation of the set of IO circuits 318 of FIG. 3, and similar detailed description is omitted.

In some embodiments, the set of IO circuits 518 is configured to read the fourth set of check bits CB4 stored in ECC memory cell array 508.

The set of IO circuits 518 includes at least one or more of sense amplifier circuits 518*a*1, 518*a*2, 518*a*3, 518*a*4, 518*a*5, or 518*a*6. In some embodiments, each sense amplifier circuit of sense amplifier circuit 518*a*1, 518*a*2, 518*a*3, 518*a*4, 518*a*5, or 518*a*6 is a multiple input channel sense amplifier (e.g., L-to-1).

Other numbers of sense amplifier circuits in sense amplifier circuits 518*a*1, 518*a*2 518*a*3, 518*a*4, 518*a*5, or 518*a*6 are within the scope of the present disclosure.

Each sense amplifier circuit of sense amplifier circuits 518*a*1, 518*a*2, 518*a*3, 518*a*4, 518*a*5 or 518*a*6 is coupled to a corresponding ECC memory cell array in ECC memory cell arrays 508*a*1, 508*a*2, 508*a*3, 508*a*4, 508*a*5 or 508*a*6 by L corresponding local bit lines (not labelled).

In some embodiments, each sense amplifier circuit of sense amplifier circuit 314*a*1, 314*a*2, . . . , 314*a*16 is configured to output a corresponding output signal Q28, Q29, . . . , Q43 during a corresponding read operation. In some embodiments, each output signal Q28, Q29, . . . , Q43 is a corresponding data value stored in corresponding memory cell array **304*a*1, 304*a*2, . . . , 304*a*15 or 304*a*16. In some embodiments, the output signals Q28, Q29, . . . , Q43 is the second set of data D2 stored in memory cell array 304**.

In some embodiments, each sense amplifier circuit of sense amplifier circuit **518*a*1, 518*a*2, 518*a*3, 518*a*4, 518*a*5 or 518*a*6 is configured to output a corresponding output signal Q22, Q23, Q24, Q25, Q26 or Q27. In some embodiments, each output signal Q22, Q23, Q24, Q25, Q26, Q27 is a corresponding data value stored in corresponding ECC memory cell array 508*a*1, 508*a*2, 508*a*3, 508*a*4, 508*a*5, 508*a*6. In some embodiments, each output signal Q22, Q23, Q24, Q25, Q26, Q27 is a corresponding ECC check bit of the fourth set of ECC check bits CB4 generated by ECC encoder/decoder circuit 332*b* based on output signal Q28, Q29, . . . , Q43. In some embodiments, the ECC encoder/decoder circuit 332*b* utilizes the fourth set of ECC check bits CB4 (output signal Q22, Q23, Q24, Q25, Q26, Q27) to determine if an error occurs in the output signal Q28, Q29, . . . , Q43**.

In some embodiments, integrated circuit 500 includes 44 IO circuits (e.g., set of IO circuits **510*a* and 510*b*), and integrated circuit 500 is configured to output 44 bits as the output signal Q (e.g, output signal Q0-Q43**).

In some embodiments, integrated circuit 500 is configured to correct at least a second number of errors in the first set of data D1 and the second set of data D2 based on the third set of ECC check bits CB3 and the fourth set of ECC check bits CB4. In some embodiments, the second number of errors is 2 bits. In some embodiments, the second number of errors is 1 bit. In some embodiments, the second number of errors is more than 2 bits. Other number of errors for the second number of errors are within the scope of the present disclosure.

Other numbers of output signals, IO circuits or bits as the output signal Q are within the scope of the present disclosure.

In some embodiments, ECC memory cell array 506 and the set of IO circuits 516 are referred to as an ECC circuit **505*a***.

In some embodiments, ECC memory cell array 508 and the set of IO circuits 518 are referred to as an ECC circuit **505*b***.

In some embodiments, ECC memory cell array 506 of ECC circuit **505*a* is configured to store the third set of ECC check bits CB3, and the set of IO circuits 516 of ECC circuit 505*a* are configured to read the third set of ECC check bits CB3 from the ECC memory cell array 506 of ECC circuit 505*b***.

In some embodiments, ECC memory cell array 508 of ECC circuit **505*b* is configured to store the fourth set of ECC check bits CB4, and the set of IO circuits 518 of ECC circuit 505*b* are configured to read the fourth set of ECC check bits CB4 from the ECC memory cell array 508 of ECC circuit 505*b***.

ECC encoder/decoder circuit **332*a* is configured to generate the third set of ECC check bits CB3 based on the first set of data D1**.

ECC encoder/decoder circuit **332*b* is configured to generate the fourth number of ECC check bits CB4 based on the second set of data D2**.

The ECC encoder/decoder circuit **332*a* and the ECC encoder/decoder circuit 332*b* are configured to correct at least the second number of errors in the first set of data D1 and the second set of data D2 based on the third set of ECC check bits CB3 and the fourth set of ECC check bits CB4**.

In some embodiments, the ECC encoder/decoder circuits **332*a* and 332*b* are configured to correct at least the second number of errors in output signal Q0, Q1, . . . , Q15 and output signal Q28, Q29, . . . , Q43 based on output signal Q16, Q17, Q18, Q19, Q20, Q21 and output signal Q22, Q23, Q24, Q25, Q26, Q27**.

In some embodiments, by including at least one of ECC encoder/decoder circuits **332*a* and 332*b*, ECC circuit 505*a* or ECC circuit 505*b* in integrated circuit 500, integrated circuit 500** has error correcting capability that results in improved DPPM compared to other approaches while also occupying less area than other approaches.

In some embodiments, by including at least one of ECC encoder/decoder circuits **332*a* and 332*b*, ECC circuit 505*a* or ECC circuit 505*b* in integrated circuit 500, integrated circuit 500** has error correcting capability that results in improved DPPM compared to other approaches while having more area efficiency than other approaches.

Other configurations of integrated circuit 500 are within the scope of the present disclosure.

Figure 6A:
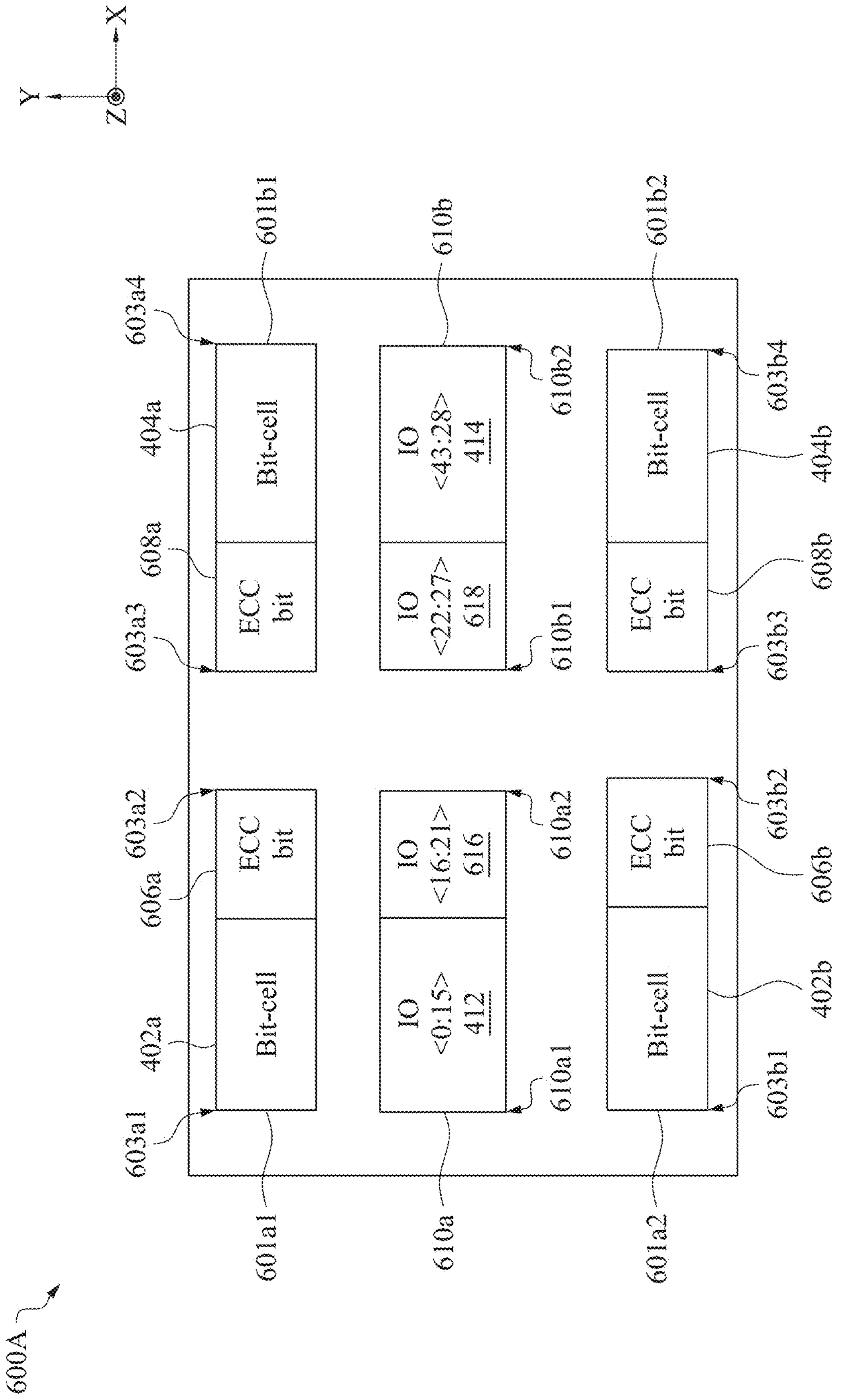
FIG. 6A is a top view of an integrated circuit, in accordance with some embodiments.

FIG. 6A is a top view of an integrated circuit 600A, in accordance with some embodiments.

Integrated circuit 600A is an embodiment of a portion of integrated circuit 500, and similar detailed description is therefore omitted. For example, integrated circuit 600A is an embodiment of a portion of integrated circuit 500 where the third set of ECC check bits CB3 are located on an inner portion (e.g., side **603*a*2 or 603*b*2) of memory cell array 601*a*1 or 601*a*2, and the fourth set of ECC check bits CB4 are located on an inner portion (e.g., side 603*a*3 or 603*b*3) of memory cell array 601*b*1 or 601*b*2**, and similar detailed description is therefore omitted.

In some embodiments, FIG. 6A is a layout of a portion of integrated circuit 600A.

Integrated circuit 600A includes a memory cell array **601*a*1, a memory cell array 601*a*2, a memory cell array 601*b*1, a memory cell array 601*b*2, a set of IO circuits 610*a* and a set of IO circuits 610*b***.

Integrated circuit 600A is a variation of integrated circuit 400A of FIG. 4A, and similar detailed description is omitted.

In comparison with integrated circuit 400A of FIG. 4A, memory cell array **601*a*1 replaces memory cell array 401*a*1, memory cell array 601*a*2 replaces memory cell array 401*a*2, memory cell array 601*b*1 replaces memory cell array 401*b*1, memory cell array 601*b*2 replaces memory cell array 401*b*2, set of IO circuits 610*a* replaces set of IO circuits 410*a*, and set of IO circuits 610*b* replaces set of IO circuits 410*b***, and similar detailed description is therefore omitted.

In some embodiments, memory cell array **601*a*1 and memory cell array 601*a*2 are corresponding upper banks and lower banks of memory cell array 501*a* of FIG. 5**, and similar detailed description is omitted.

In some embodiments, memory cell array **601*b*1 and memory cell array 601*b*2 are corresponding upper banks and lower banks of memory cell array 501*b* of FIG. 5**, and similar detailed description is omitted.

In some embodiments, the set of IO circuits **610*a* is the set of IO circuits 510*a* of FIG. 5, and similar detailed description is omitted. In some embodiments, the set of IO circuits 610*b* is the set of IO circuits 510*b* of FIG. 5**, and similar detailed description is omitted.

Memory cell array **601*a*1 includes memory cell array 402*a* and an ECC memory cell array 606*a***.

In comparison with integrated circuit 400A of FIG. 4A, ECC memory cell array 606*a* replaces ECC memory cell array 406*a*, and similar detailed description is therefore omitted.

ECC memory cell array 606*a* is configured to store the third set of check bits CB3.

In some embodiments, memory cell array 402*a* is an upper bank of memory cell array 302 of FIG. 5, and similar detailed description is omitted. In some embodiments, ECC memory cell array 606*a* is an upper bank of ECC memory cell array 506 of FIG. 5, and similar detailed description is omitted.

Memory cell array 601*a*1 further includes a first end 603*a*1 and a second end 603*a*2 opposite from the first end 603*a*1.

Memory cell array 402*a* is located on the first end 603*a*1 of memory cell array 601*a*1. ECC memory cell array 606*a* is located on the second end 603*a*2 of memory cell array 601*a*1.

Memory cell array 601*a*2 includes memory cell array 402*b* and an ECC memory cell array 606*b*.

In comparison with integrated circuit 400A of FIG. 4A, ECC memory cell array 606*b* replaces ECC memory cell array 406*b*, and similar detailed description is therefore omitted.

ECC memory cell array 606*b* is configured to store the third set of check bits CB3.

In some embodiments, memory cell array 402*b* is a lower bank of memory cell array 302 of FIG. 5, and similar detailed description is omitted. In some embodiments, ECC memory cell array 606*b* is a lower bank of ECC memory cell array 506 of FIG. 5, and similar detailed description is omitted.

Memory cell array 601*a*2 further includes a first end 603*b*1 and a second end 603*b*2 opposite from the first end 603*b*1.

Memory cell array 402*b* is located on the first end 603*b*1 of memory cell array 601*a*2. ECC memory cell array 606*b* is located on the second end 603*b*2 of memory cell array 601*a*2.

Memory cell array 601*b*1 includes memory cell array 404*a* and an ECC memory cell array 608*a*.

ECC memory cell array 608*a* is configured to store the fourth set of check bits CB4.

In some embodiments, memory cell array 404*a* is an upper bank of memory cell array 304 of FIG. 5, and similar detailed description is omitted. In some embodiments, ECC memory cell array 608*a* is an upper bank of ECC memory cell array 508 of FIG. 5, and similar detailed description is omitted.

Memory cell array 601*b*1 further includes a first end 603*a*3 and a second end 603*a*4 opposite from the first end 603*a*3.

Memory cell array 404*a* is located on the second end 603*a*4 of memory cell array 601*b*1. ECC memory cell array 608*a* is located on the first end 603*a*3 of memory cell array 601*b*1.

Memory cell array 601*b*2 includes memory cell array 404*b* and an ECC memory cell array 608*b*.

Memory cell array 404*b* is configured to store the second set of data D2. ECC memory cell array 608*b* is configured to store the fourth set of check bits CB4.

In some embodiments, memory cell array 404*b* is a lower bank of memory cell array 304 of FIG. 5, and similar detailed description is omitted. In some embodiments, ECC memory cell array 608*b* is a lower bank of ECC memory cell array 508 of FIG. 5, and similar detailed description is omitted.

Memory cell array 601*b*2 further includes a first end 603*b*3 and a second end 603*b*4 opposite from the first end 603*b*3.

Memory cell array 404*b* is located on the second end 603*b*4 of memory cell array 601*b*2. ECC memory cell array 608*b* is located on the first end 603*b*3 of memory cell array 601*b*2.

The set of IO circuits 610*a* includes set of sense amplifier circuits 412 and a set of sense amplifier circuits 616.

In some embodiments, the set of sense amplifier circuits 616 is sense amplifier circuits 516*a*1, 516*a*2, 516*a*3, 516*a*4, 516*a*5, 516*a*6 of FIG. 5, and similar detailed description is omitted.

The set of IO circuits 610*a* further includes a first end 610*a*1 and a second end 610*a*2 opposite from the first end 610*a*1.

The set of sense amplifier circuits 412 is located on the first end 610*a*1 of the set of IO circuits 610*a*. The set of sense amplifier circuits 616 is located on the second end 610*a*2 of the set of IO circuits 610*a*.

The set of IO circuits 610*b* includes set of sense amplifier circuits 414 and a set of sense amplifier circuits 618.

In some embodiments, the set of sense amplifier circuits 618 is sense amplifier circuits 518*a*1, 518*a*2, 518*a*3, 518*a*4, 518*a*5, 518*a*6 of FIG. 5, and similar detailed description is omitted.

The set of IO circuits 610*b* further includes a first end 610*b*1 and a second end 610*b*2 opposite from the first end 610*b*1.

The set of sense amplifier circuits 414 is located on the second end 610*b*2 of the set of IO circuits 610*b*. The set of sense amplifier circuits 618 is located on the first end 610*b*1 of the set of IO circuits 610*b*.

Integrated circuit 600A achieves the benefits discussed herein.

Other configurations of integrated circuit 600A are within the scope of the present disclosure.

Figure 6B:
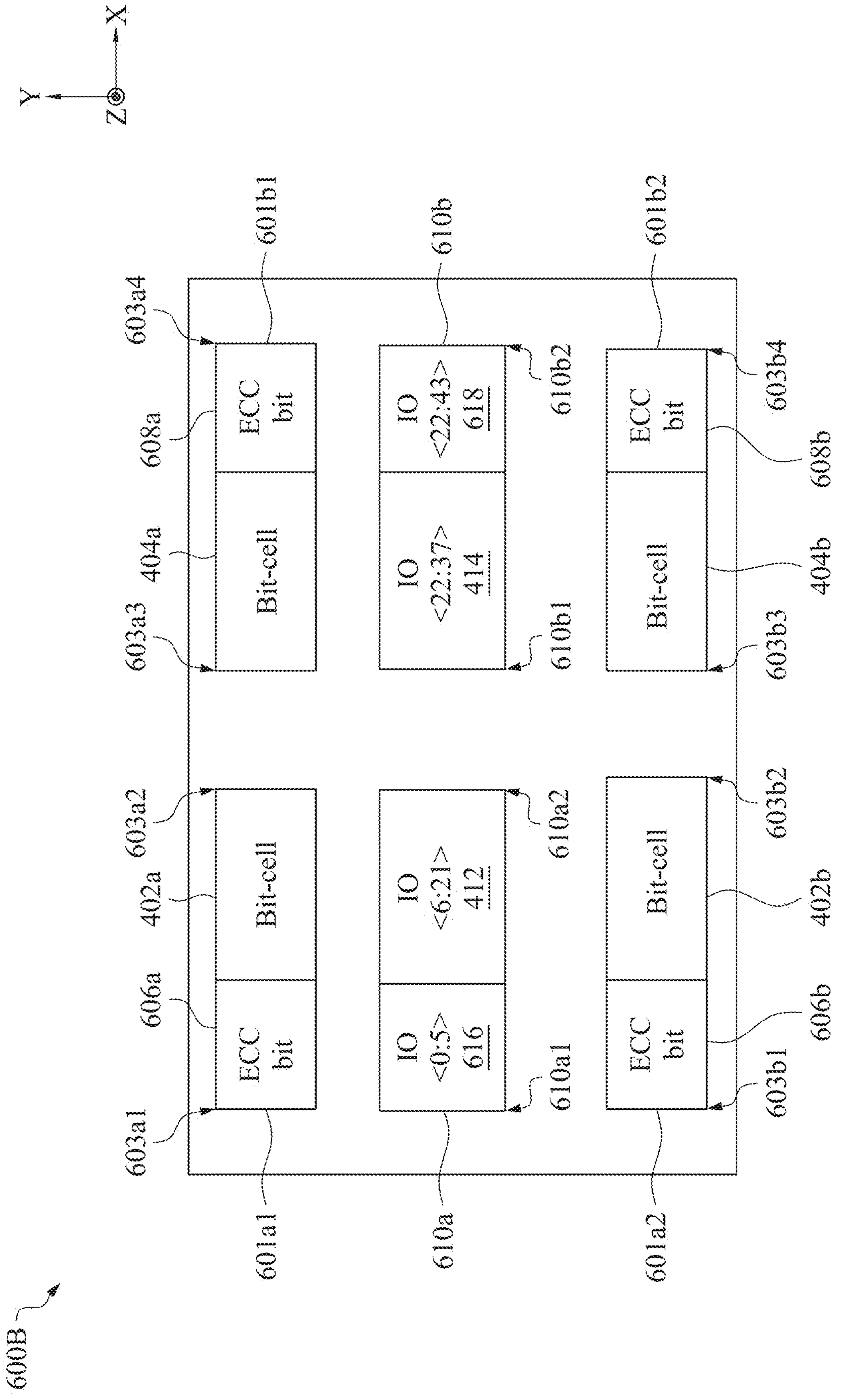
FIG. 6B is a top view of an integrated circuit, in accordance with some embodiments.

FIG. 6B is a top view of an integrated circuit 600B, in accordance with some embodiments.

Integrated circuit 600B is an embodiment of a portion of integrated circuit 500, and similar detailed description is therefore omitted.

Integrated circuit 600B is a variation of integrated circuit 600A of FIG. 6A, and similar detailed description is omitted. In comparison with integrated circuit 600A of FIG. 6A, the third set of ECC check bits CB3 are located on an outer portion (e.g., side 603*a*1 or 603*b*1) of memory cell array 601*a*1 or 601*a*2, and the fourth set of ECC check bits CB4 are located on an outer portion (e.g., side 603*a*4 or 603*b*4) of memory cell array 601*b*1 or 601*b*2, and similar detailed description is therefore omitted.

In some embodiments, FIG. 6A is a layout of a portion of integrated circuit 600B.

Memory cell array 402*a* is located on the second end 603*a*2 of memory cell array 601*a*1. ECC memory cell array 606*a* is located on the first end 603*a*1 of memory cell array 601*a*1.

Memory cell array 402*b* is located on the second end 603*b*2 of memory cell array 601*a*2. ECC memory cell array 606*b* is located on the first end 603*b*1 of memory cell array 601*a*2.

Memory cell array 404*a* is located on the first end 603*a*3 of memory cell array 601*b*1. ECC memory cell array 608*a* is located on the second end 603*a*4 of memory cell array 601*b*1.

Memory cell array 404*b* is located on the first end 603*b*3 of memory cell array 601*b*2. ECC memory cell array 608*b* is located on the second end 603*b*4 of memory cell array 601*b*2.

The set of sense amplifier circuits 412 is located on the second end 610*a*2 of the set of IO circuits 610*a*. The set of sense amplifier circuits 616 is located on the first end 610*a*1 of the set of IO circuits 610*a*.

The set of sense amplifier circuits 414 is located on the first end 610*b*1 of the set of IO circuits 610*b*. The set of sense amplifier circuits 618 is located on the second end 610*b*2 of the set of IO circuits 610*b*.

Integrated circuit 600B achieves the benefits discussed herein.

Other configurations of integrated circuit 600B are within the scope of the present disclosure.

Figure 7A:
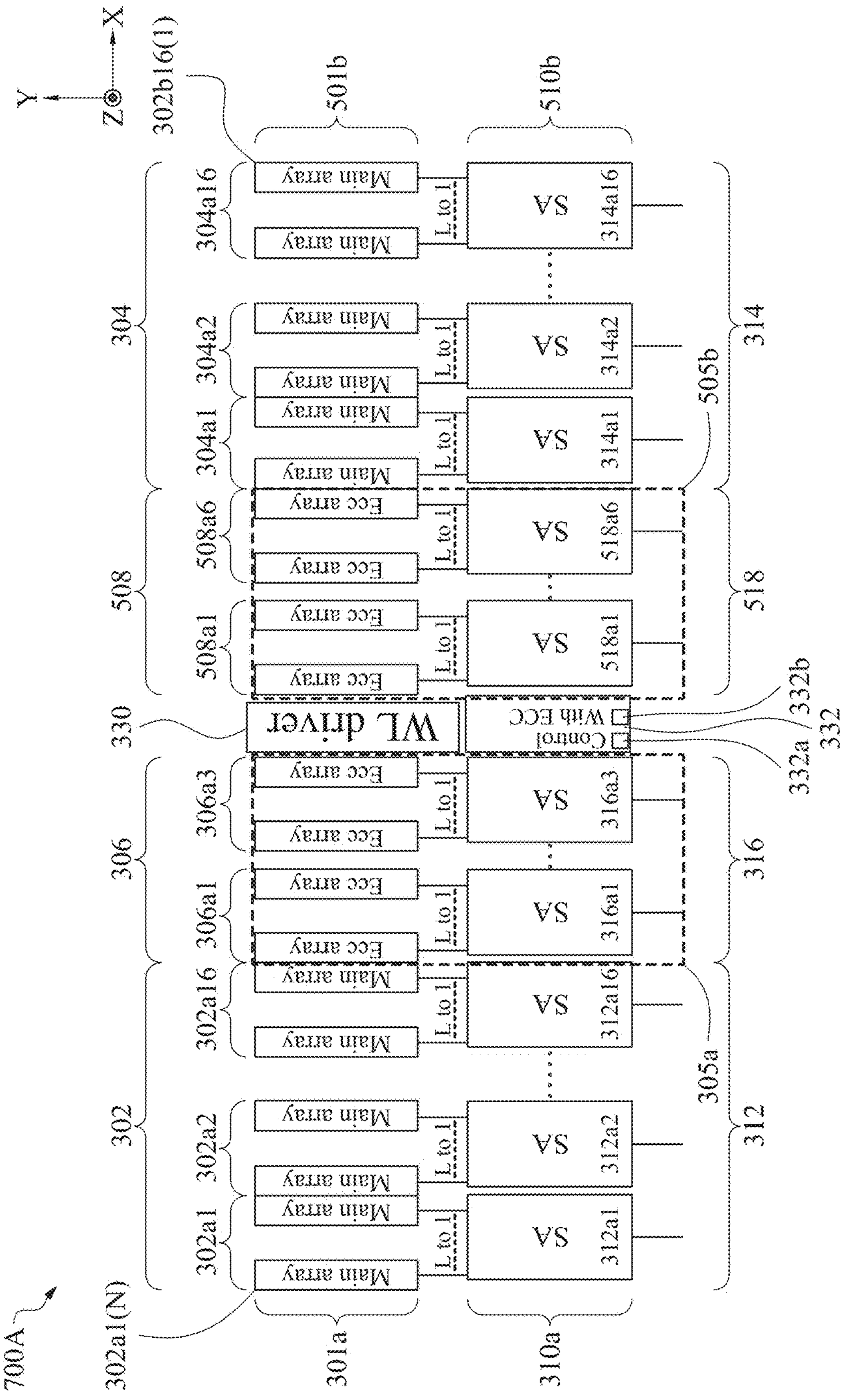
FIG. 7A is a block diagram of an integrated circuit usable in FIG. 1, in accordance with some embodiments.

FIG. 7A is a block diagram of an integrated circuit 700A usable in FIG. 1, in accordance with some embodiments.

Integrated circuit 700A relates to integrated circuit 100 of FIG. 1. Integrated circuit 700A is an embodiment of integrated circuit 100, and similar detailed description is omitted.

Integrated circuit 700A is a variation of integrated circuit 300 of FIG. 3 and integrated circuit 500 of FIG. 5, and similar detailed description is omitted. Stated differently, in some embodiments, Integrated circuit 700A is a hybrid between integrated circuit 300 of FIG. 3 and integrated circuit 500 of FIG. 5. For example, in some embodiments, integrated circuit 700A includes the set of memory cells 301*a* and the set of IO circuits 310*a* of FIG. 3, and the set of memory cells 501*b* and the set of IO circuits 510*b* of FIG. 5, and similar detailed description is therefore omitted.

In some embodiments, by including the set of memory cells 301*a* and the set of IO circuits 310*a* of FIG. 3, and the set of memory cells 501*b* and the set of IO circuits 510*b* of FIG. 5, integrated circuit 700A is configured to output the output signal Q, and the output signal Q includes 41 bits (e.g., output signal Q1-Q40). In some embodiments, integrated circuit 700A is configured to use 9 bits for ECC protection of the output signal Q.

Integrated circuit 700A includes the set of memory cells 301*a*, the set of memory cells 501*b*, the set of IO circuits 310*a*, the set of IO circuits 510*b*, the word line driver circuit 330 and the control circuit 332.

In some embodiments, the ECC encoder/decoder circuits 332*a* and 332*b* are configured to correct at least the first number of errors in output signal Q0, Q1, . . . , Q15 and output signal Q25, Q26, . . . , Q40 based on output signal Q16, Q17, Q18 and output signal Q19, Q20, Q21, Q22, Q23, Q24.

In comparison with integrated circuit 500 of FIG. 5, in some embodiments, each sense amplifier circuit of sense amplifier circuit 314*a*1, 314*a*2, . . . , 314*a*16 is configured to output a corresponding output signal Q25, Q26, . . . , Q40 during a corresponding read operation. In some embodiments, each output signal Q25, Q26, . . . , Q40 is a corresponding data value stored in corresponding memory cell array 304*a*1, 304*a*2, . . . , 304*a*15 or 304*a*16. In some embodiments, the output signals Q25, Q26, . . . , Q40 is the second set of data D2 stored in memory cell array 304.

In some embodiments, each sense amplifier circuit of sense amplifier circuit 518*a*1, 518*a*2, 518*a*3, 518*a*4, 518*a*5 or 518*a*6 is configured to output a corresponding output signal Q19, Q20, Q21, Q22, Q23 or Q24. In some embodiments, each output signal Q19, Q20, Q21, Q22, Q23, Q24 is a corresponding data value stored in corresponding ECC memory cell array 508*a*1, 508*a*2, 508*a*3, 508*a*4, 508*a*5, 508*a*6. In some embodiments, each output signal Q19, Q20, Q21, Q22, Q23, Q24 is a corresponding ECC check bit of the fourth set of ECC check bits CB4 generated by ECC encoder/decoder circuit 332*b* based on output signal Q25, Q26, . . . , Q40. In some embodiments, the ECC encoder/decoder circuit 332*b* utilizes the fourth set of ECC check bits CB4 (output signal Q19, Q20, Q21, Q22, Q23, Q24) to determine if an error occurs in the output signal Q25, Q26, . . . , Q40.

In some embodiments, integrated circuit 700A includes 41 IO circuits (e.g., set of IO circuits 310*a* and 510*b*), and integrated circuit 700A is configured to output 41 bits as the output signal Q (e.g., output signal Q0-Q40).

Integrated circuit 700A achieves the benefits discussed herein.

Other configurations of integrated circuit 700A are within the scope of the present disclosure.

Figure 7B:
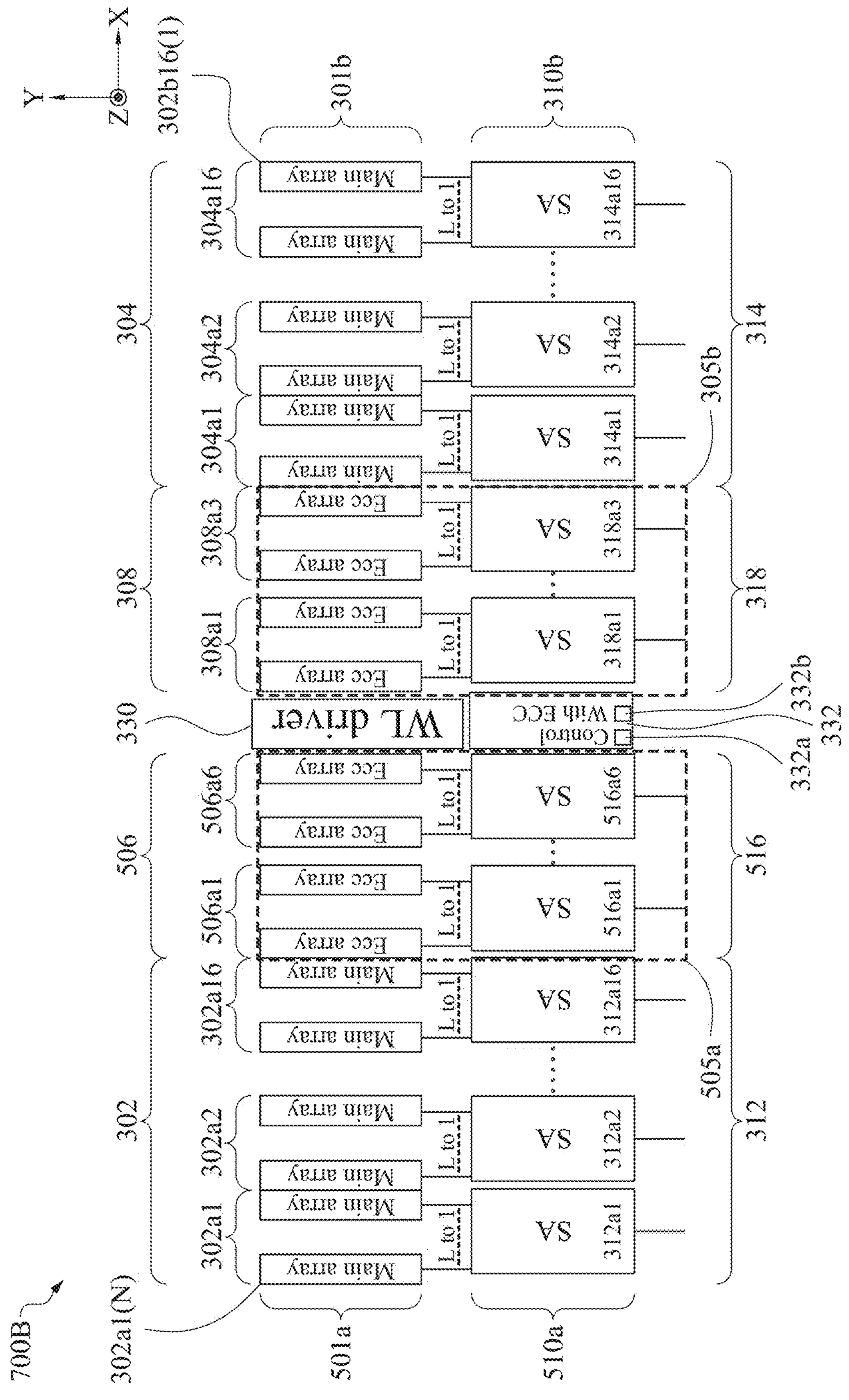
FIG. 7B is a block diagram of an integrated circuit usable in FIG. 1, in accordance with some embodiments.

FIG. 7B is a block diagram of an integrated circuit 700B usable in FIG. 1, in accordance with some embodiments.

Integrated circuit 700B is a variation of integrated circuit 300 of FIG. 3 and integrated circuit 500 of FIG. 5, and similar detailed description is omitted. Stated differently, in some embodiments, integrated circuit 700B is a hybrid between integrated circuit 300 of FIG. 3 and integrated circuit 500 of FIG. 5. For example, in some embodiments, integrated circuit 700B includes the set of memory cells 501*a* and the set of IO circuits 510*a* of FIG. 5, and the set of memory cells 301*b* and the set of IO circuits 310*b* of FIG. 3, and similar detailed description is therefore omitted.

In some embodiments, by including the set of memory cells 501*a* and the set of IO circuits 510*a* of FIG. 5, and the set of memory cells 301*b* and the set of IO circuits 310*b* of FIG. 3, integrated circuit 700B is configured to output the output signal Q, and the output signal Q includes 41 bits (e.g., output signal Q0-Q40). In some embodiments, integrated circuit 700B is configured to use 9 bits for ECC protection of the output signal Q.

Integrated circuit 700B includes the set of memory cells 501*a*, the set of memory cells 301*b*, the set of IO circuits 510*a*, the set of IO circuits 310*b*, the word line driver circuit 330 and the control circuit 332.

In some embodiments, the ECC encoder/decoder circuits 332*a* and 332*b* are configured to correct at least the first number of errors in output signal Q0, Q1, . . . , Q15 and output signal Q25, Q26, . . . , Q40 based on output signal Q16, Q17, Q18, Q19, Q20, Q21 and output signal Q22, Q23, Q24.

In comparison with integrated circuit 300 of FIG. 3, in some embodiments, each sense amplifier circuit of sense amplifier circuit 314*a*1, 314*a*2, . . . , 314*a*16 is configured to output a corresponding output signal Q25, Q26, . . . , Q40 during a corresponding read operation. In some embodiments, each output signal Q25, Q26, . . . , Q40 is a corresponding data value stored in corresponding memory cell array 304*a*1, 304*a*2, . . . , 304*a*15 or 304*a*16. In some embodiments, the output signals Q25, Q26, . . . , Q40 is the second set of data D2 stored in memory cell array 304.

In some embodiments, each sense amplifier circuit of sense amplifier circuit 318*a*1, 318*a*2 or 318*a*3 is configured to output a corresponding output signal Q22, Q23 or Q24. In some embodiments, each output signal Q22, Q23, Q24 is a corresponding data value stored in corresponding ECC memory cell array 308*a*1, 308*a*2, 308*a*3. In some embodiments, each output signal Q22, Q23, Q24 is a corresponding ECC check bit of the second set of ECC check bits CB2 generated by ECC encoder/decoder circuit 332*b* based on output signal Q25, Q26, . . . , Q40. In some embodiments, the ECC encoder/decoder circuit 332*b* utilizes the second set of ECC check bits CB2 (output signal Q22, Q23, Q24) to determine if an error occurs in the output signal Q25, Q26, . . . , Q40.

In some embodiments, integrated circuit 700B includes 41 IO circuits (e.g., set of IO circuits 510*a* and 310*b*), and integrated circuit 700B is configured to output 41 bits as the output signal Q (e.g., output signal Q0-Q40).

Integrated circuit 700B achieves the benefits discussed herein.

Other configurations of integrated circuit 700B are within the scope of the present disclosure.

Figure 8A:
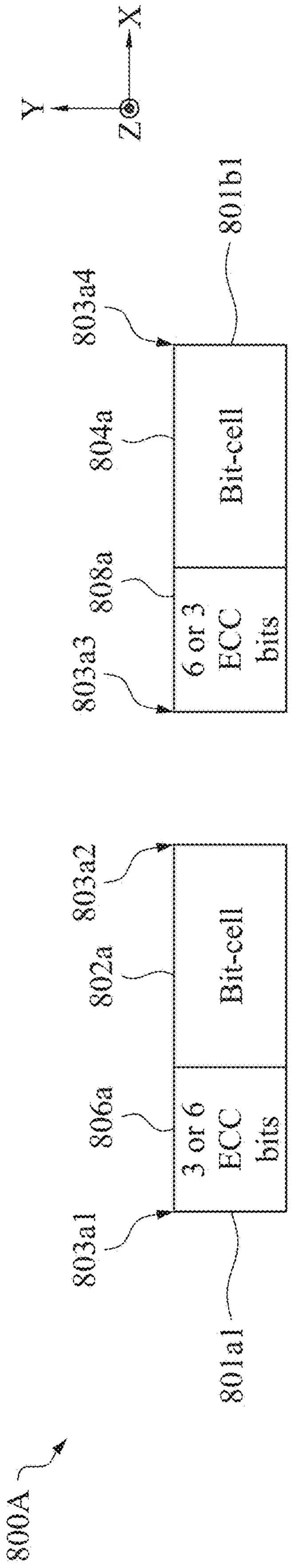
FIG. 8A is a top view of an integrated circuit, in accordance with some embodiments.

FIG. 8A is a top view of an integrated circuit 800A, in accordance with some embodiments.

Integrated circuit 800A is an embodiment of a portion of integrated circuit 700A or 700B, and similar detailed description is therefore omitted. For example, integrated circuit 800A is an embodiment of a portion of integrated circuit 700A or 700B where the first set of ECC check bits CB1 or the third set of ECC check bits CB3 is located on an outer portion (e.g., side 803*a*1) of memory cell array 801*a*1, and the second set of ECC check bits CB2 or the fourth set of ECC check bits CB4 is located on an inner portion (e.g., side 803*a*3) of memory cell array 801*b*1, and similar detailed description is therefore omitted.

In some embodiments, FIG. 8A is a layout of a portion of integrated circuit 800A.

Integrated circuit 800A includes a memory cell array 801*a*1 and a memory cell array 801*b*1.

Integrated circuit 800A is a variation of integrated circuit 400A of FIG. 4A, and similar detailed description is omitted.

In comparison with integrated circuit 400A of FIG. 4A, memory cell array 801*a*1 replaces memory cell array 401*a*1, and memory cell array 801*b*1 replaces memory cell array 401*b*1, and similar detailed description is therefore omitted.

Memory cell array 801*a*1 includes memory cell array 802*a* and an ECC memory cell array 806*a*.

In comparison with integrated circuit 400A of FIG. 4A, memory cell array 802*a* replaces memory cell array 402*a*, and ECC memory cell array 806*a* replaces ECC memory cell array 406*a*, and similar detailed description is therefore omitted.

ECC memory cell array 806*a* is configured to store the first set of ECC check bits CB1 or the third set of ECC check bits CB3.

In some embodiments, memory cell array 802*a* is memory cell array 302 of FIGS. 7A-7B, and similar detailed description is omitted. In some embodiments, ECC memory cell array 806*a* is ECC memory cell array 306 of FIG. 7A or ECC memory cell array 506 of FIG. 7B, and similar detailed description is omitted.

Memory cell array 801*a*1 further includes a first end 803*a*1 and a second end 803*a*2 opposite from the first end 803*a*1.

Memory cell array 802*a* is located on the second end 803*a*2 of memory cell array 801*a*1. ECC memory cell array 806*a* is located on the first end 803*a*1 of memory cell array 801*a*1.

Memory cell array 801*b*1 includes memory cell array 804*a* and an ECC memory cell array 808*a*.

In comparison with integrated circuit 400A of FIG. 4A, memory cell array 804*a* replaces memory cell array 404*a*, and ECC memory cell array 808*a* replaces ECC memory cell array 408*a*, and similar detailed description is therefore omitted.

ECC memory cell array 808*a* is configured to store the second set of ECC check bits CB2 or the fourth set of ECC check bits CB4.

In some embodiments, memory cell array 804*a* is memory cell array 304 of FIGS. 7A-7B, and similar detailed description is omitted. In some embodiments, ECC memory cell array 808*a* is ECC memory cell array 508 of FIG. 7A or ECC memory cell array 308 of FIG. 7B, and similar detailed description is omitted.

Memory cell array 801*b*1 further includes a first end 803*a*3 and a second end 803*a*4 opposite from the first end 803*a*3.

Memory cell array 804*a* is located on the second end 803*a*4 of memory cell array 801*b*1. ECC memory cell array 808*a* is located on the first end 803*a*3 of memory cell array 801*b*1.

Integrated circuit 800A achieves the benefits discussed herein.

Other configurations of integrated circuit 800A are within the scope of the present disclosure.

Figure 8B:
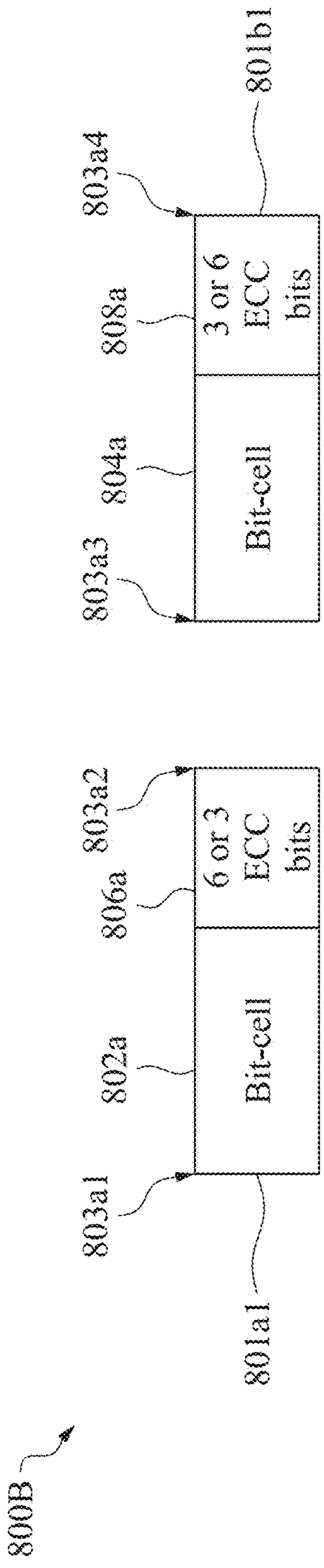
FIG. 8B is a top view of an integrated circuit, in accordance with some embodiments.

FIG. 8B is a top view of an integrated circuit 800B, in accordance with some embodiments.

Integrated circuit 800B is a variation of integrated circuit 800A of FIG. 8A, and similar detailed description is omitted. For example, integrated circuit 800B is an embodiment of a portion of integrated circuit 700A or 700B where the first set of ECC check bits CB1 or the third set of ECC check bits CB3 is located on an inner portion (e.g., side 803*a*2) of memory cell array 801*a*1, and the second set of ECC check bits CB2 or the fourth set of ECC check bits CB4 is located on an outer portion (e.g., side 803*a*4) of memory cell array 801*b*1, and similar detailed description is therefore omitted.

In FIG. 8B, memory cell array 802*a* is located on the first end 803*a*1 of memory cell array 801*a*1. In FIG. 8B, ECC memory cell array 806*a* is located on the second end 803*a*2 of memory cell array 801*a*1.

In FIG. 8B, memory cell array 804*a* is located on the first end 803*a*3 of memory cell array 801*b*1. In FIG. 8B, ECC memory cell array 808*a* is located on the second end 803*a*4 of memory cell array 801*b*1.

Integrated circuit 800B achieves the benefits discussed herein.

Other configurations of integrated circuit 800B are within the scope of the present disclosure.

Figure 9A:
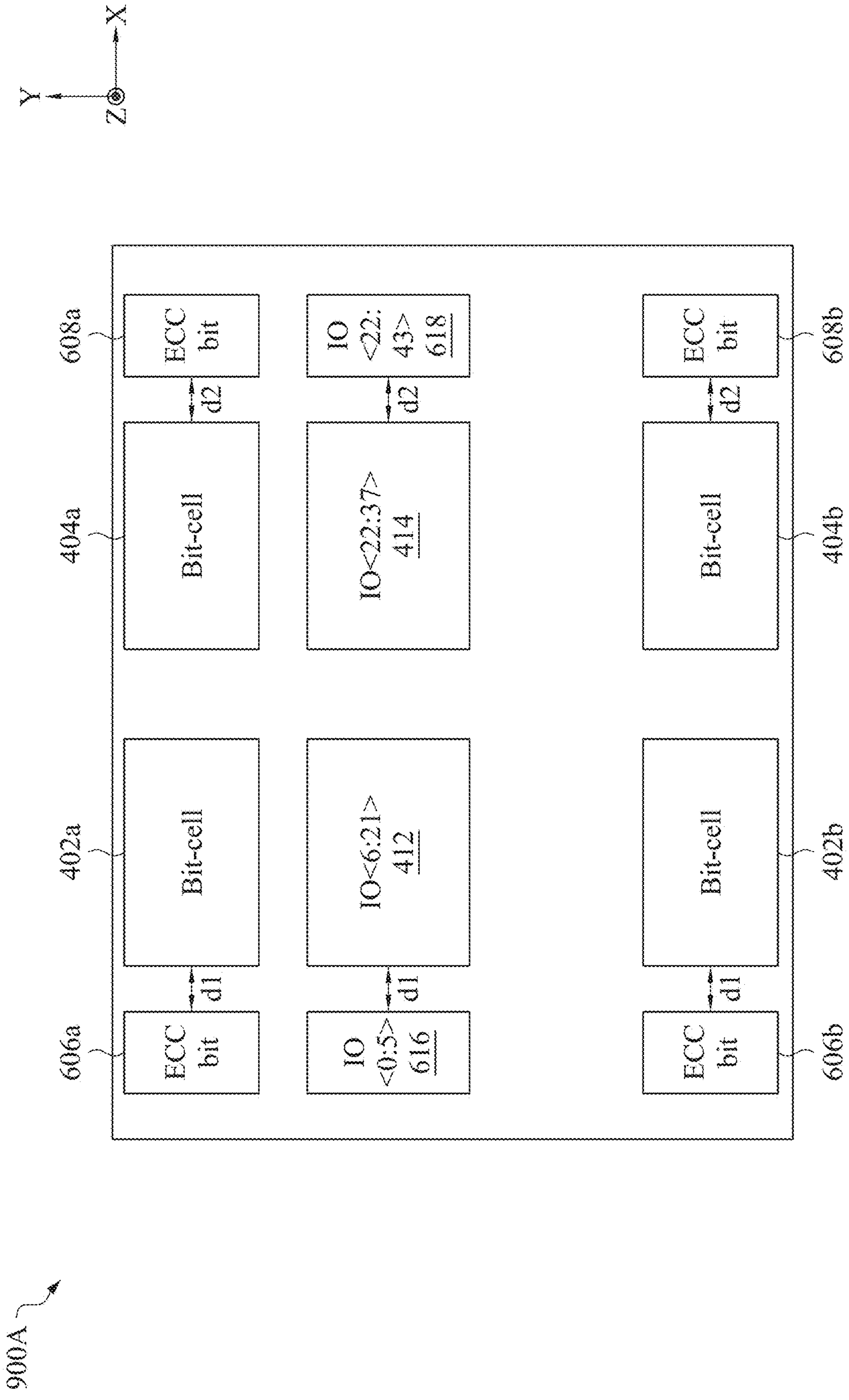
FIG. 9A is a top view of an integrated circuit, in accordance with some embodiments.

FIG. 9A is a top view of an integrated circuit 900A, in accordance with some embodiments.

Integrated circuit 900A is a variation of integrated circuit 600B of FIG. 6B, and similar detailed description is omitted. For example, integrated circuit 900A is an embodiment of a portion of integrated circuit 600B of FIG. 6B where the memory cell arrays and the ECC memory cell arrays are separated from each other by a distance d1 or d2, and where the set of IO circuits and the set of ECC IO circuits are separated from each other by distance d1 or d2, and similar detailed description is therefore omitted. Stated differently, integrated circuit 900A is an embodiment of a portion of integrated circuit 600B of FIG. 6B where the memory cell arrays and the ECC memory cell arrays are part of separate memory cell arrays that are separated from each other by an insulating material, and where the set of IO circuits and the set of ECC IO circuits are part of separate IO circuits that are separated from each other by the insulating material.

In comparison with integrated circuit 600B of FIG. 6B, in FIG. 9A, a side of memory cell array 402*a* and a side of ECC memory cell array 606*a* are separated from each other by a distance d1.

In comparison with integrated circuit 600B of FIG. 6B, in FIG. 9A, a side of memory cell array 402*b* and a side of ECC memory cell array 606*b* are separated from each other by distance d1.

In comparison with integrated circuit 600B of FIG. 6B, in FIG. 9A, a side of memory cell array 404*a* and a side of ECC memory cell array 608*a* are separated from each other by a distance d2.

In comparison with integrated circuit 600B of FIG. 6B, in FIG. 9A, a side of memory cell array 404*b* and a side of ECC memory cell array 608*b* are separated from each other by distance d2.

In some embodiments, distance d1 is equal to distance d2. In some embodiments, distance d1 is different from distance d2.

In comparison with integrated circuit 600B of FIG. 6B, in FIG. 9A, a side of the set of IO circuits 616 and a side of the set of IO circuits 412 are separated from each other by distance d1.

In comparison with integrated circuit 600B of FIG. 6B, in FIG. 9A, a side of the set of IO circuits 618 and a side of the set of IO circuits 414 are separated from each other by distance d2.

Integrated circuit 900A achieves the benefits discussed herein.

Other configurations of integrated circuit 900A are within the scope of the present disclosure.

Figure 9B:
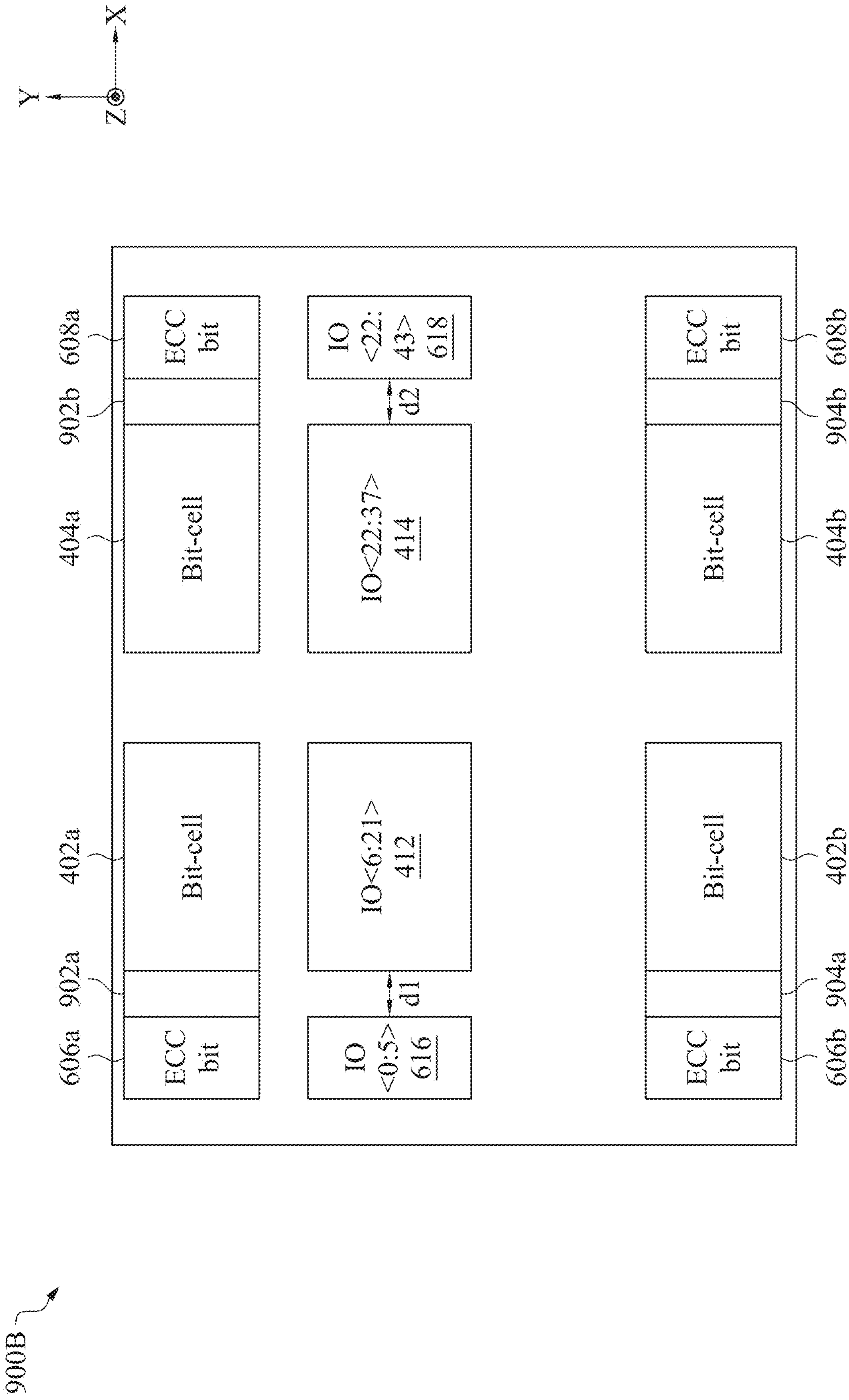
FIG. 9B is a top view of an integrated circuit, in accordance with some embodiments.

FIG. 9B is a top view of an integrated circuit 900B, in accordance with some embodiments.

Integrated circuit 900B is a variation of integrated circuit 900A of FIG. 9A, and similar detailed description is omitted. In comparison with integrated circuit 900A of FIG. 9A, integrated circuit 900B of FIG. 9B further includes ECC control circuits 902*a*, 902*b*, 904*a* and 904*b*.

ECC control circuit 902*a* is between memory cell array 402*a* and ECC memory cell 606*a*.

ECC control circuit 902*b* is between memory cell array 404*a* and ECC memory cell 608*a*.

ECC control circuit 904*a* is between memory cell array 402*b* and ECC memory cell 606*b*.

ECC control circuit 904*b* is between memory cell array 404*b* and ECC memory cell 608*b*.

In some embodiments, ECC control circuit 902*a*, 902*b*, 904*a* or 904*b* is configured to enable or disable corresponding ECC memory cell array 606*a*, 608*a*, 606*b* or 608*b*. In some embodiments, ECC control circuit 902*a*, 902*b*, 904*a* or 904*b* is configured to enable or turn-on corresponding ECC memory cell array 606*a*, 608*a*, 606*b* or 608*b* when ECC functions are used. In some embodiments, ECC control circuit 902*a*, 902*b*, 904*a* or 904*b* is configured to disable or turn-off corresponding ECC memory cell array 606*a*, 608*a*, 606*b* or 608*b* when ECC functions are not used.

Integrated circuit 900B achieves the benefits discussed herein.

Other configurations of integrated circuit 900B are within the scope of the present disclosure.

Figure 10:
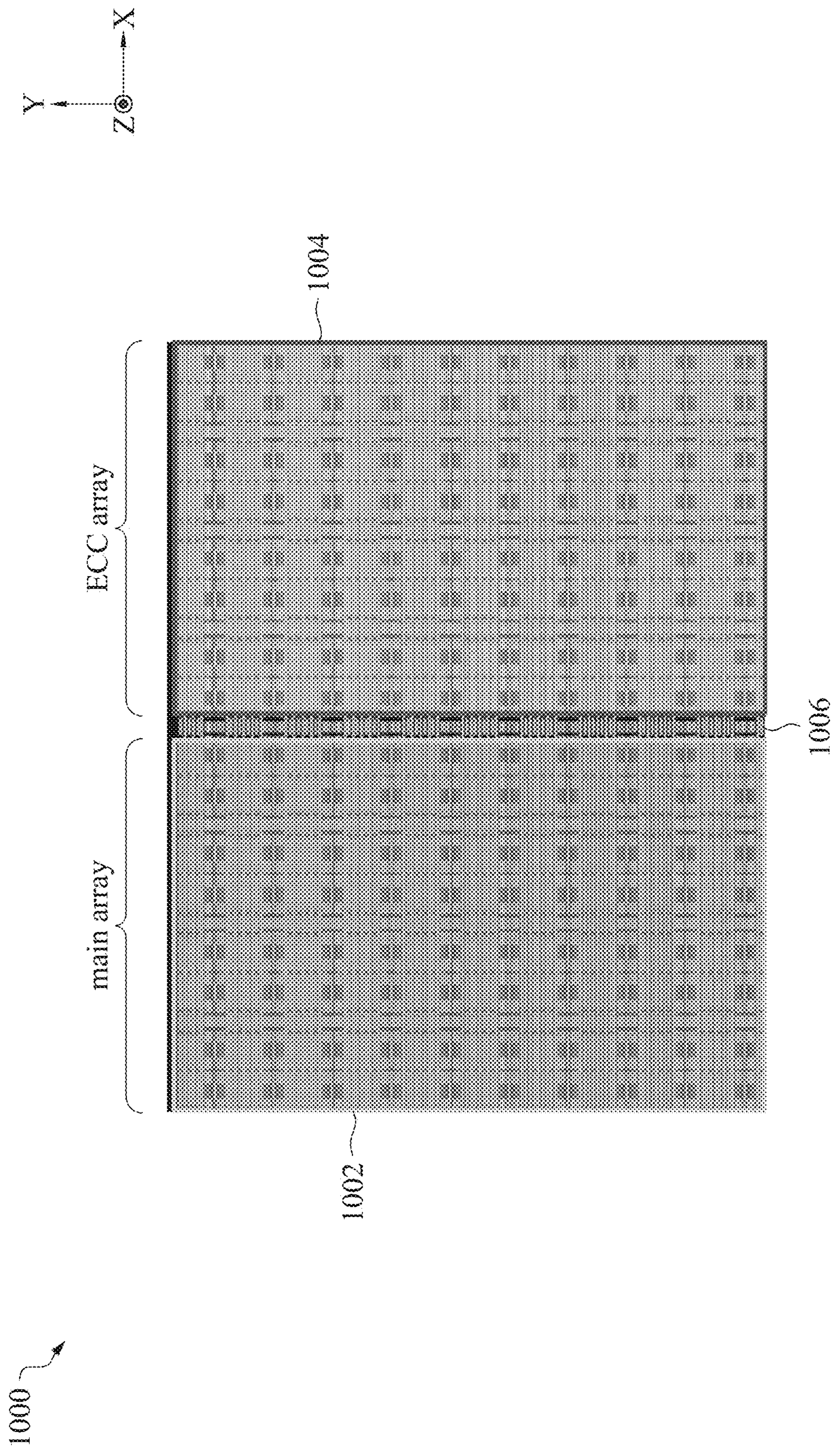
FIG. 10 is a top view of an integrated circuit, in accordance with some embodiments.

FIG. 10 is a top view of an integrated circuit 1000, in accordance with some embodiments.

Integrated circuit 1000 is an embodiment of a portion of integrated circuit 900B, and similar detailed description is therefore omitted. For example, integrated circuit 900B is an embodiment of the ECC control circuit 902*b*, memory cell array 404*a* and ECC memory cell 608*a*, and similar detailed description is therefore omitted.

In some embodiments, FIG. 10 is a layout of a portion of integrated circuit 1000.

Integrated circuit 1000 includes a memory cell array 1002, an ECC memory cell array 1004 and a set of circuits 1006.

In some embodiments, memory cell array 1002 is memory cell array 404*a* of FIG. 9B, and ECC memory cell array 1004 is ECC memory cell array 608*a* of FIG. 9B, and similar detailed description is omitted.

In some embodiments, the set of circuits 1006 is ECC control circuit 902*b* of FIG. 9B, and similar detailed description is omitted.

In some embodiments, the set of circuits 1006 includes a set of dummy memory cells. In some embodiments, a dummy memory cell is a non-functional memory cell. In some embodiments, the set of circuits 1006 includes a set of strap cells. In some embodiments, the set of strap cells are memory cells configured to provide voltage pick-up and to provide N-well or P-well bias, and are referred to as a "voltage pick-up region." In some embodiments, the voltage pick-up region is useable to reduce latch-up, and is also referred to as a guard ring.

Integrated circuit 1000 achieves the benefits discussed herein.

Other configurations of integrated circuit 1000 are within the scope of the present disclosure.

Figure 11A:
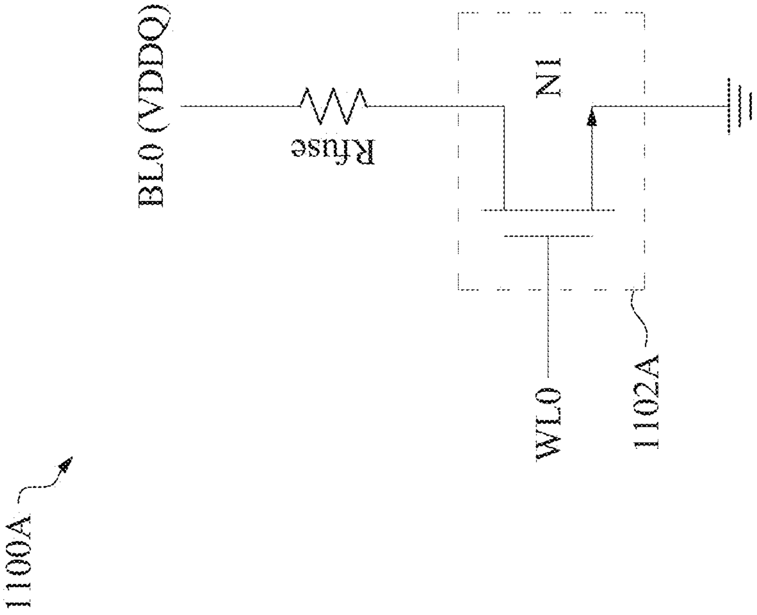
FIGS. 11A-11B are diagrams of corresponding circuits, in accordance with some embodiments.
Figure 11B:
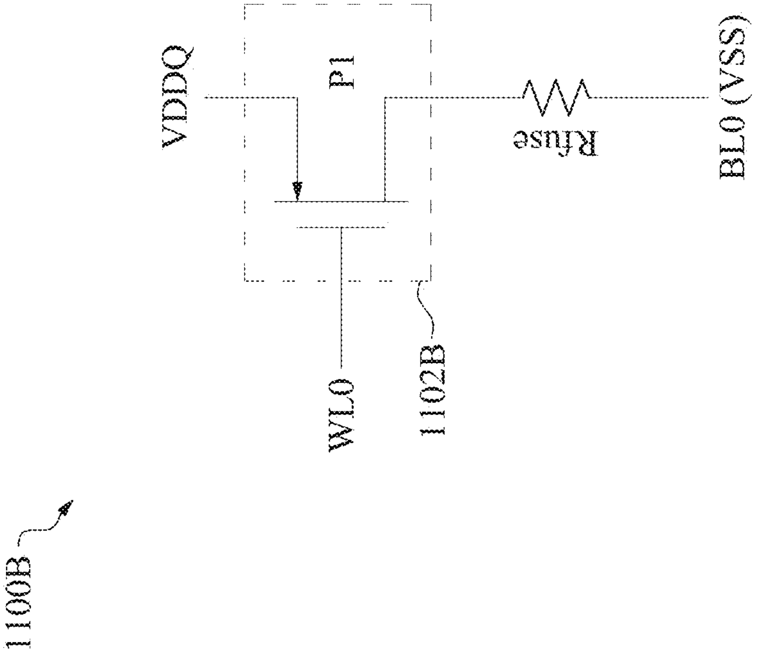

FIGS. 11A-11B are diagrams of corresponding circuits 1100A-1100B, in accordance with some embodiments.

In some embodiments, circuits 1100A-1100B are embodiments of memory circuit 200 of FIG. 2, and similar detailed description is omitted.

In some embodiments, circuits 1100A-1100B are one or more of memory cells in memory cell arrays 102, 401*a*1, 401*a*2, 401*b*1, 401*b*2, 601*a*1, 601*a*2, 601*b*1, 601*b*2, 801*a*1 or 1002, memory circuit 200, or set of memory cells 301*a*, 301*b*, 501*a* or 501*b*, and similar detailed description is omitted.

Circuit 1100A includes an eFuse Rfuse, a bit line BL, a word line WL0 and a programming circuit 1102*a*.

The eFuse Rfuse is between the bit line BL and the programming circuit 1102*a*. The programming circuit 1102*a* is coupled between the eFuse Rfuse and a reference voltage supply VSS.

The programming circuit 1102*a* includes at least an n-type Metal-Oxide-Semiconductor (NMOS) transistor N1.

A gate of the NMOS transistor N1 is coupled to the word line WL0. A drain of the NMOS transistor N1 is coupled to a first end of the eFuse Rfuse. A source of the NMOS transistor N1 is coupled to the reference voltage supply VSS. A second end of the eFuse Rfuse is coupled to the bit line BL0.

Two or more circuit elements are considered to be coupled based on a direct electrical connection, a resistive or reactive electrical connection, or an electrical connection that includes one or more additional circuit elements and is thereby capable of being controlled, e.g., made resistive or open by a transistor or other switching device.

Circuit 1100B includes the eFuse Rfuse, the bit line BL, the word line WL0 and a programming circuit 1102*b*.

The eFuse Rfuse is between the bit line BL and the programming circuit 1102*b*. The programming circuit 1102*b* is coupled between the eFuse Rfuse and a voltage supply VDD.

The programming circuit 1102*b* includes at least a p-type Metal-Oxide-Semiconductor (PMOS) transistor P1.

A gate of the PMOS transistor P1 is coupled to the word line WL0. A drain of the PMOS transistor P1 is coupled to the second end of the eFuse Rfuse. A source of the PMOS transistor P1 is coupled to the voltage supply VDD. A first end of the eFuse Rfuse is coupled to the bit line BL0. In some embodiments, the bit line BL0 is configured to receive a bit line signal. In some embodiments, the bit line signal is equal to a voltage supply VDDQ. In some embodiments, the bit line signal is equal to a reference voltage supply VSS.

In some embodiments, word line signals on word line WL0 are configured to select or deselect a bit cell including circuit 1100A-1100B in a programming or read operation.

Circuits 1100A-1100B are shown as 1 transistor 1 resistor (1T1R) eFuse devices. Other numbers of transistors or resistors for at least one of circuit 1100A or 1100B are within the scope of the disclosure. Other memory types for at least one of circuit 1100A or 1100B are within the scope of the disclosure.

EFuse Rfuse is a circuit device including a conductive element capable of being sustainably altered, and thereby programmed, by a current Ifuse having a magnitude that exceeds a predetermined current level. In a non-programmed state, eFuse Rfuse has a small resistance relative to a resistance in a programmed state. In some embodiments, eFuse Rfuse includes an eFuse R1 discussed below with respect to FIGS. 12A-12B.

Each one of program devices 1102A and 1102B is an IC device capable of switching between conductive and resistive states responsive to an input signal, e.g., word line signals on word line WL0. In a conductive state, the program device 1102A or 1102B has a low resistance current path between two current path terminals (not labeled), and, in a resistive state, the program device 1102A or 1102B has a high resistance current path between the two current path terminals.

In the conductive state, the program device 1102A or 1102B is capable of having the low resistance current path only for current values up to a predetermined current saturation level, and has a significantly higher relative resistance path for current values above the saturation level. In operation, the program device 1102A or 1102B thereby acts to limit the value of a current flowing between the two current path terminals in response to an increasing voltage difference across the two current path terminals.

In various embodiments, program devices 1102A and 1102B are same or different program devices. Same program devices have low resistance current paths having substantially the same resistance value and substantially the same saturation level. In various embodiments, different program devices have low resistance current paths having one or both of substantially different resistance values or substantially different saturation levels.

In some embodiments, one or both of program devices 1102A or 1102B includes a transmission gate, a MOS transistor, a field effect transistor (FET), a FinFET, a bipolar transistor, or other suitable IC device capable of switching between conductive and resistive states responsive to an input signal. In various embodiments, program devices 1102A and 1102B include FinFETs having a same number of fins and a same number of gates, or FinFETs having different numbers of one or both of fins and/or gates.

Because program devices 1102A and 1102B are responsive to separate input signals, program devices 1102A and 1102B are separately controllable. In various embodiments, one or both of program devices 1102A or 1102B is configured to respond to an input signal having logic levels corresponding to the respective conductive and resistive states.

In the embodiment depicted in FIG. 11A, NMOS transistor NO is configured to be in the conductive state responsive to the word line signal having a high logic level, and to be in the resistive state responsive to the word line signal having a low logic level.

In the embodiment depicted in FIG. 11B, PMOS transistor P0 is configured to be in the conductive state responsive to the word line signal having the low logic level, and to be in the resistive state responsive to the word line signal having the high logic level.

Circuits 1100A-1100B achieve the benefits discussed herein.

Other configurations of circuits 1100A-1100B are within the scope of the present disclosure.

Figure 12A:
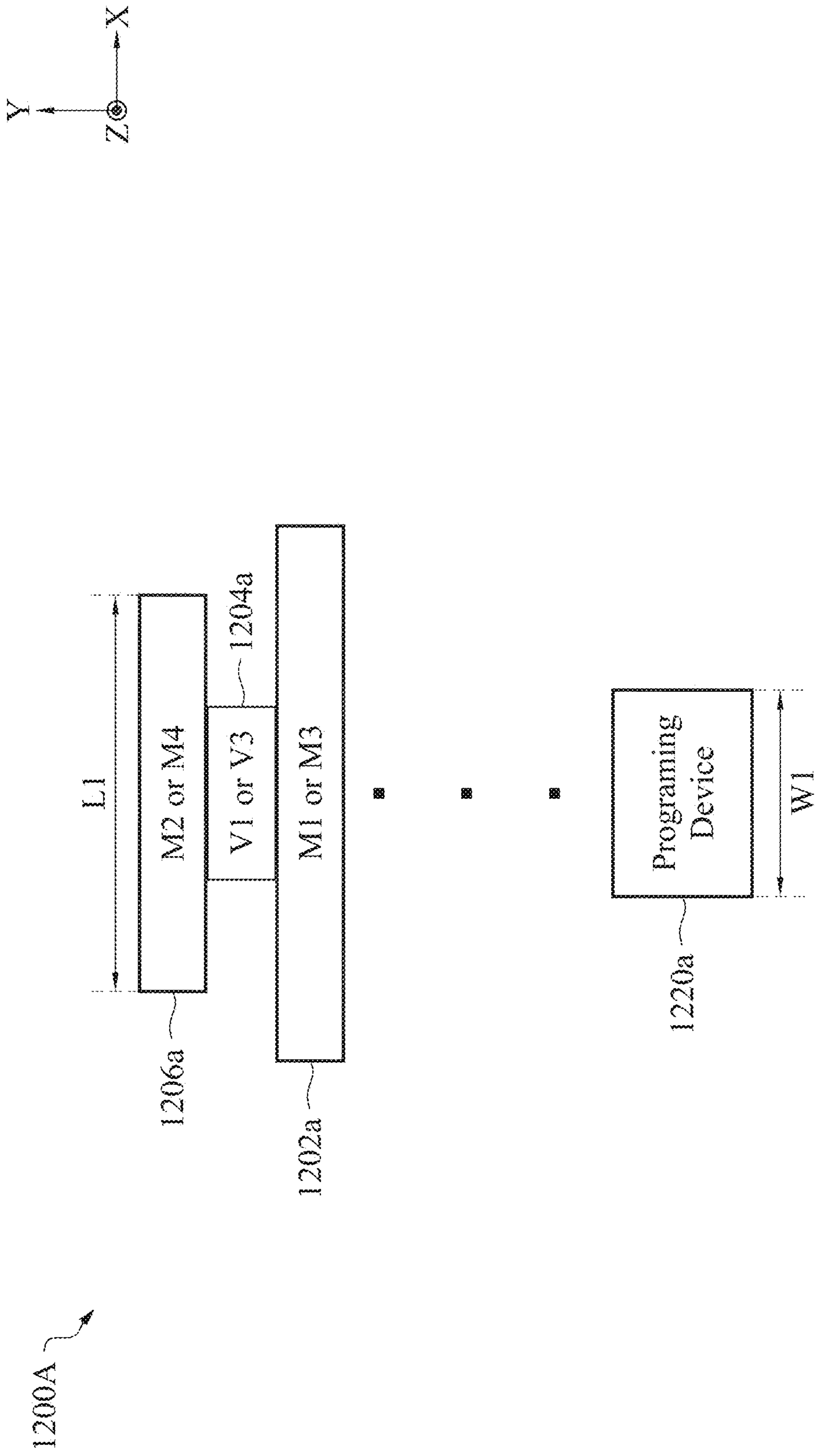
FIGS. 12A-12B are diagrams of cross-sectional views of corresponding integrated circuits, in accordance with some embodiments.
Figure 12B:
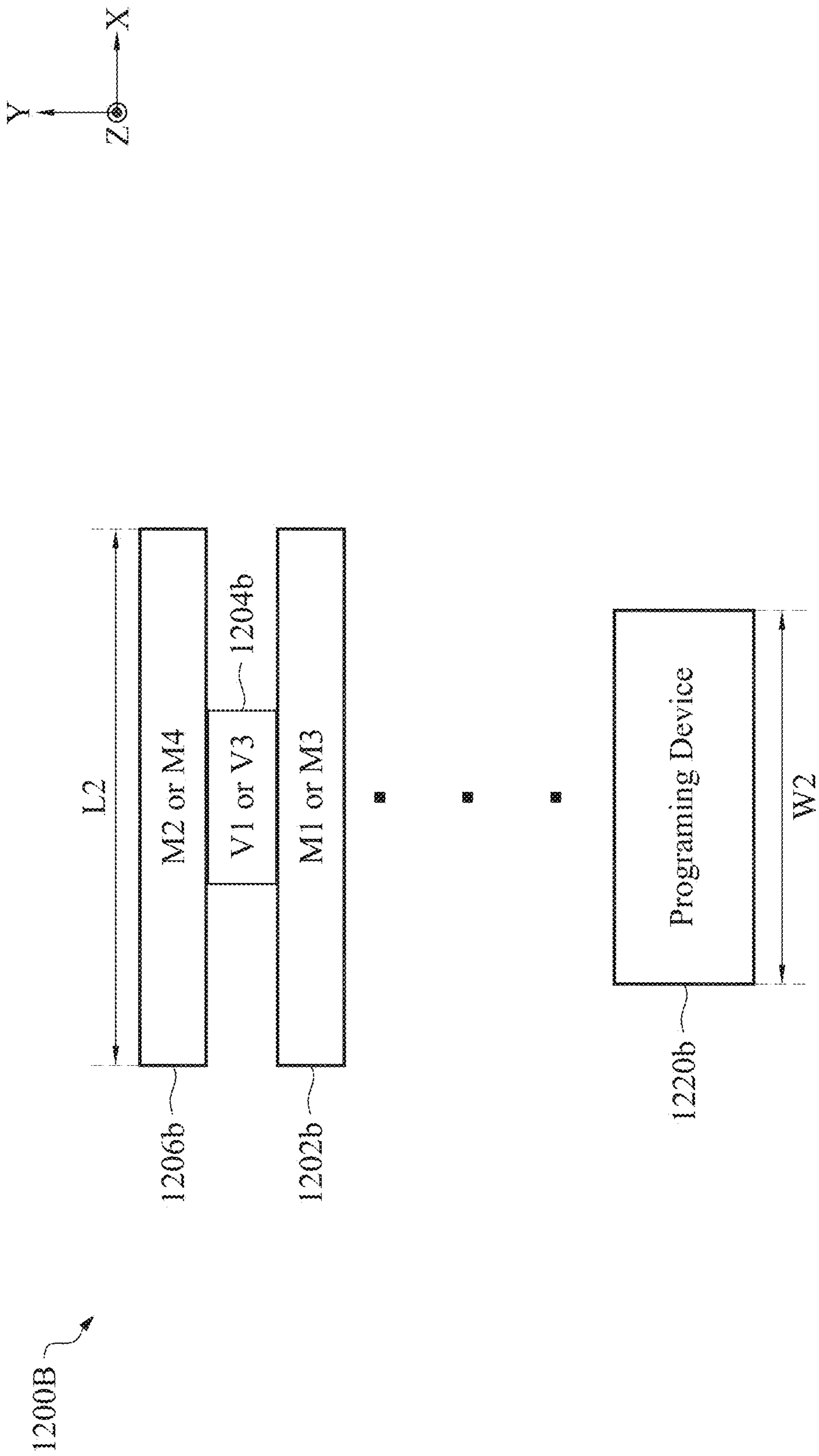

FIGS. 12A-12B are diagrams of cross-sectional views of corresponding integrated circuits 1200A-1200B, in accordance with some embodiments.

FIG. 12A is a cross-sectional view of the eFuse Rfuse of circuit 1100A or 1100B of FIG. 11A or 11B, in accordance with some embodiments.

FIG. 12B is a cross-sectional view of the eFuse Rfuse of circuit 1100A or 1100B of FIG. 11A or 11B, in accordance with some embodiments.

Integrated circuit 1200A includes a conductive structure 1202*a*, a via 1204*a*, a conductive structure 1206*a* and a programming device 1220*a*.

In some embodiments, conductive structure 1206*a* is eFuse Rfuse of FIGS. 11A-11B, and similar detailed description is omitted. In some embodiments, programming device 1220*a* is programming device 1102A or 1102B of FIG. 11A or 11B, and similar detailed description is omitted. Programming device 1220*a* is connected to conductive structure 1202*a*, but is not shown in FIG. 12A for ease of illustration.

Conductive structure 1206*a* is above conductive structure 1202*a* and programming device 1220*a*. Conductive structure 1206*a* is connected to conductive structure 1202*a* by via 1204*a*. Via 1204*a* is between conductive structure 1206*a* and conductive structure 1202*a*. Conductive structure 1202*a* is above programming device 1220*a*. Programming device 1220*a* is connected to conductive structure 1202*a* by other structures (not shown).

Conductive structure 1206*a* has a length L1 in a first direction X.

Programming device 1220*a* has a length W1 in the first direction X.

In some embodiments, conductive structure 1202*a* is on a metal-1 (M1) layer or a metal-3 (M3) layer. In some embodiments, conductive structure 1206*a* is on a metal-2 (M2) layer or a metal-4 (M4) layer. In some embodiments, via 1204*a* is on a via over M1 (V1) layer or a via over M3 (V3) layer.

Other configurations, arrangements on other layers or quantities of structures in FIG. 12A are within the scope of the present disclosure.

Integrated circuit 1200B includes a conductive structure 1202*b*, a via 1204*b*, a conductive structure 1206*b* and a programming device 1220*b*.

In some embodiments, conductive structure 1206*b* is eFuse Rfuse of FIGS. 11A-11B, and similar detailed description is omitted. In some embodiments, programming device 1220*b* is programming device 1102A or 1102B of FIG. 11A or 11B, and similar detailed description is omitted. Programming device 1220*b* is connected to conductive structure 1202*b*, but is not shown in FIG. 12B for ease of illustration.

Conductive structure 1206*b* is above conductive structure 1202*b* and programming device 1220*b*. Conductive structure 1206*b* is connected to conductive structure 1202*b* by via 1204*b*. Via 1204*b* is between conductive structure 1206*b* and conductive structure 1202*b*. Conductive structure 1202*b* is above programming device 1220*b*. Programming device 1220*b* is connected to conductive structure 1202*b* by other structures (not shown).

Conductive structure 1206*b* has a length L2 in the first direction X. In some embodiments, length L2 is greater than length L1. In some embodiments, length L2 is equal to length L1.

Programming device 1220*b* has a length W2 in the first direction X. In some embodiments, length W2 is greater than length W1. In some embodiments, length W2 is equal to length W1.

In some embodiments, conductive structure 1202*b* is on the M1 layer or the M3 layer. In some embodiments, conductive structure 1206*b* is on the M2 layer or the M4 layer. In some embodiments, via 1204*b* is on the V1 layer or the V3 layer.

Other configurations, arrangements on other layers or quantities of structures in FIG. 12B are within the scope of the present disclosure.

In some embodiments, conductive structure 1206*a* is an eFuse in memory cell array 1002, and conductive structure 1206*b* is an eFuse in ECC memory cell array 1004. In these embodiments, the length L2 is greater than the length L1, and therefore conductive structure 1206*a* can be programmed with a lower voltage than conductive structure 1206*b* can be programmed. In these embodiments, the length W2 is greater than the length W1, and therefore conductive structure 1206*a* can be programmed with a lower voltage than conductive structure 1206*b* can be programmed.

In some embodiments, conductive structure 1206*a* is on the M2 layer, via 1204*a* is on the V1 layer, conductive structure 1202*a* is on the M1 layer and conductive structure 1206*b* is on the M4 layer, via 1204*b* is on the V3 layer, conductive structure 1202*b* is on the M3 layer. In some embodiments, by arranging conductive structure 1206*a* below conductive structure 1206*b*, integrated circuit 1200A has more security than other approaches where the eFuse in memory cell array are exposed.

In some embodiments, conductive structure 1206*b* is an eFuse in memory cell array 1002, and conductive structure 1206*a* is an eFuse in ECC memory cell array 1004. In these embodiments, the length L2 is greater than the length L1, and therefore conductive structure 1206*b* can be programmed with a lower voltage than conductive structure 1206*a* can be programmed.

In these embodiments, the length W2 is greater than the length W1, and therefore conductive structure 1206*b* can be programmed with a lower voltage than conductive structure 1206*a* can be programmed.

In some embodiments, conductive structure 1206*a* is on the M4 layer, via 1204*a* is on the V3 layer, conductive structure 1202*a* is on the M2 layer and conductive structure 1206*b* is on the M2 layer, via 1204*b* is on the V1 layer, conductive structure 1202*b* is on the M1 layer. In some embodiments, by arranging conductive structure 1206*a* above conductive structure 1206*b*, integrated circuit 1200B has more security than other approaches where the eFuse in the ECC memory cell array are exposed.

Integrated circuits 1200A-1200B achieve the benefits discussed herein.

Other configurations of integrated circuits 1200A-1200B are within the scope of the present disclosure.

Figure 13:
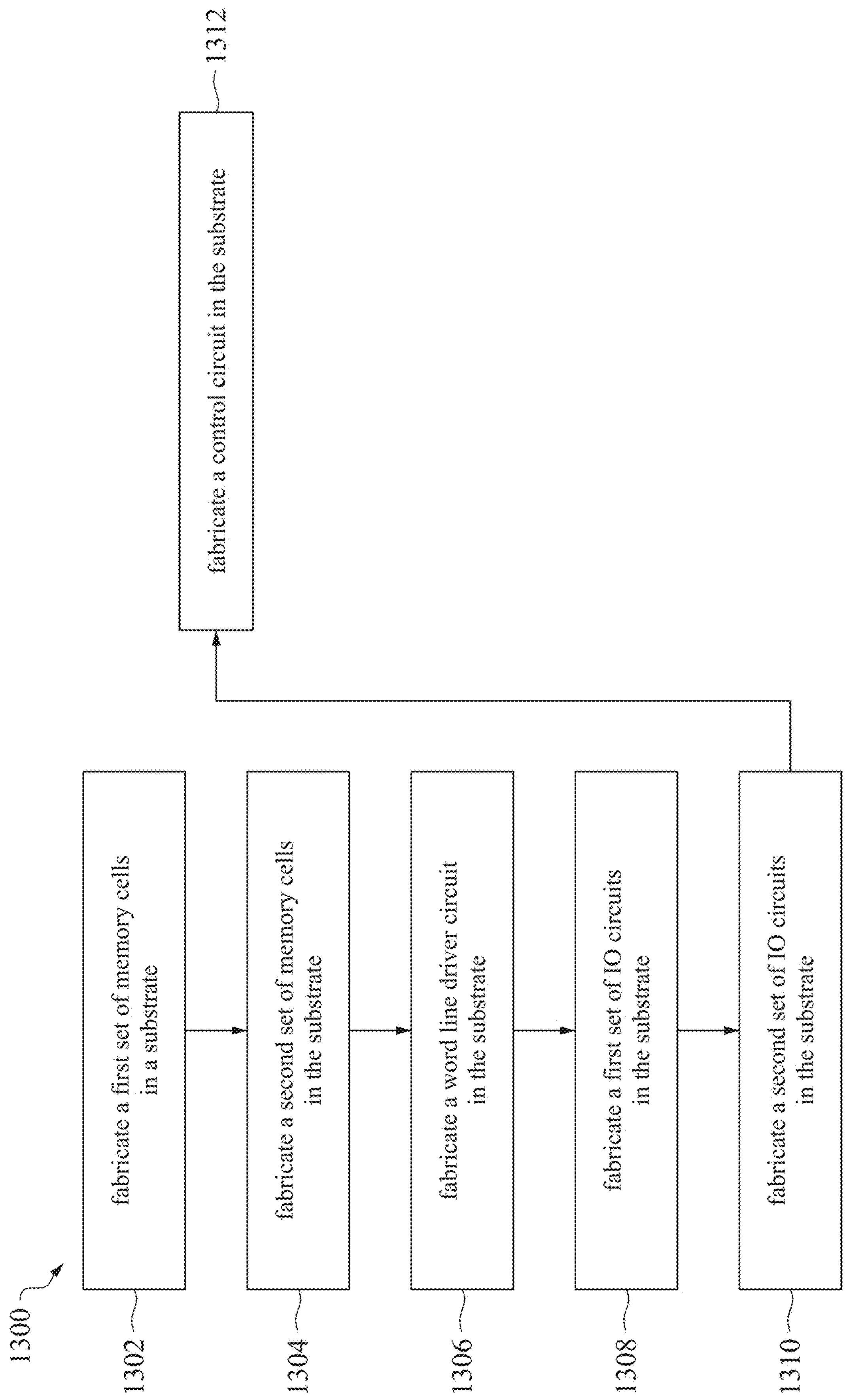
FIG. 13 is a functional flow chart of a corresponding method 1300 of manufacturing an IC device, in accordance with some embodiments.

FIG. 13 is a functional flow chart of a corresponding method 1300 of manufacturing an IC device, in accordance with some embodiments. It is understood that additional operations may be performed before, during, and/or after the method 1300 depicted in FIG. 13, and that some other processes may only be briefly described herein.

In some embodiments, other order of operations of methods 1300 & 1500 is within the scope of the present disclosure. Methods 1300 & 1500 include exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1300 or 1500 is not performed.

In some embodiments, method 1300 is usable to manufacture or fabricate at least integrated circuit 100, 300, 400A, 400B, 500, 600A, 600B, 700A, 700B, 800A, 800B, 900A, 900B, 1000, 1200A or 1200B, circuit 1100A or 1100B, or memory circuit 200.

In operation 1302 of method 1300, a first set of memory cells is fabricated in a substrate. In some embodiments, the first set of memory cells of method 1300 includes at least one of memory cell array 301*a*, 401*a*1, 401*a*2, 501*a*, 601*a*1, 601*a*2 or 801*a*1. In some embodiments, the first set of memory cells of method 1300 includes at least the first set of memory cells 102A.

In some embodiments, the first set of memory cells of method 1300 includes a first memory cell array and a first ECC memory cell array.

In some embodiments, the first memory cell array of method 1300 includes at least one of memory cell array 302, 402*a*, 402*b*, 802*a* or 1002 or at least one of integrated circuit 1100A, 1100B, 1200A or 1200B.

In some embodiments, the first ECC memory cell array of method 1300 includes at least one of ECC memory cell array 306, 406*a*, 406*b*, 506, 606*a*, 606*b*, 806*a* or 1004 or at least one of integrated circuit 1100A, 1100B, 1200A or 1200B.

In some embodiments, the first memory cell array of method 1300 includes a first set of fuse devices and a first set of programming devices. In some embodiments, the first set of fuse devices includes at least one of eFuse Rfuse or conductive structure 1206*a* or 1206*b*. In some embodiments, the first set of programming devices includes at least one of programming devices 1102A, 1102B, 1220*a* or 1220*b*.

In operation 1304 of method 1300, a second set of memory cells is fabricated in the substrate. In some embodiments, the second set of memory cells of method 1300 includes at least one of memory cell array 301*b*, 401*b*1, 401*b*2, 501*b*, 601*b*1, 601*b*2 or 801*b*1.

In some embodiments, the second set of memory cells of method 1300 includes at least the second set of memory cells 102B.

In some embodiments, the second set of memory cells of method 1300 includes a second memory cell array and a second ECC memory cell array.

In some embodiments, the second memory cell array of method 1300 includes at least one of memory cell array 304, 404*a*, 404*b*, 804*a* or 1002 or at least one of integrated circuit 1100A, 1100B, 1200A or 1200B.

In some embodiments, the second ECC memory cell array of method 1300 includes at least one of ECC memory cell array 308, 408*a*, 408*b*, 508, 608*a*, 608*b*, 808*a* or 1004 or at least one of integrated circuit 1100A, 1100B, 1200A or 1200B.

In some embodiments, the second memory cell array of method 1300 includes a second set of fuse devices and a second set of programming devices. In some embodiments, the second set of fuse devices includes at least one of eFuse Rfuse or conductive structure 1206*a* or 1206*b*. In some embodiments, the second set of programming devices includes at least one of programming device 1102A, 1102B, 1220*a* or 1220*b*.

In operation 1306 of method 1300, a word line driver circuit (330) is fabricated in the substrate. In some embodiments, the word line driver circuit is between the first set of memory cells and the second set of memory cells.

In some embodiments, the word line driver circuit includes at least one of word line driver circuit 330.

In operation 1308 of method 1300, a first set of IO circuits is fabricated in the substrate. In some embodiments, the first set of IO circuits of method 1300 includes at least one of the set of IO circuits 310*a*, 410*a*, 510*a* or 610*a*.

In some embodiments, the first set of IO circuits of method 1300 includes a first set of sense amplifiers and a first set of ECC sense amplifiers.

In some embodiments, the first set of IO circuits of method 1300 includes at least one of the set of sense amplifiers 312 or 412.

In some embodiments, the first set of IO circuits of method 1300 includes at least one of the first set of ECC sense amplifiers 316, 416, 516 or 616.

In operation 1310 of method 1300, a second set of IO circuits is fabricated in the substrate. In some embodiments, the second set of IO circuits of method 1300 includes at least one of the set of IO circuits 310*b*, 410*b*, 510*b* or 610*b*.

In some embodiments, the second set of IO circuits of method 1300 includes a second set of sense amplifiers and a second set of ECC sense amplifiers.

In some embodiments, the second set of IO circuits of method 1300 includes at least one of the set of sense amplifiers 314 or 414.

In some embodiments, the second set of IO circuits of method 1300 includes at least one of the first set of ECC sense amplifiers 318, 418, 518 or 618.

In operation 1312 of method 1300, a control circuit is fabricated in the substrate.

In some embodiments, the control circuit of method 1300 includes at least one of controller 104, X-decoder circuit 106, Y-decoder circuit 108, ECC encoder/decoder 110, first ECC encoder/decoder 110A, second ECC encoder/decoder 110B, control circuit 332, ECC encoder/decoder circuit 332*a*, ECC encoder/decoder circuit 332*b*, ECC control circuit 902*a*, 902*b*, 904*a* or 904*b*, set of circuits 1006 or system 1400.

In some embodiments, the control circuit of method 1300 includes a first ECC encoder/decoder circuit and a second ECC encoder/decoder circuit.

In some embodiments, the first ECC encoder/decoder circuit of method 1300 includes at least one of the first ECC encoder/decoder 110A or ECC encoder/decoder circuit 332*a*.

In some embodiments, the second ECC encoder/decoder circuit of method 1300 includes at least one of the second ECC encoder/decoder 110B or ECC encoder/decoder circuit 332*b*.

In some embodiments, the first ECC encoder/decoder circuit and the second ECC encoder/decoder circuit are between the first set of IO circuits and the second set of IO circuits.

In some embodiments, at least one or more of operations 1302, 1304, 1306, 1308, 1310 or 1312 includes one or more of operation 1302*a*, 1302*b*, 1302*c* or 1302*d*.

In some embodiments, operation 1302*a* includes fabricating one or more transistors, memory devices or fuses described herein in a semiconductor wafer or substrate.

In some embodiments, operation 1302*a* includes fabricating source and drain regions of the set of transistors in a first well. In some embodiments, the first well comprises p-type dopants. In some embodiments, the p-type dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/$cm^3$ to $1\times10^{14}$ atoms/$cm^3$.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/$cm^3$ to about $1\times10^{14}$ atoms/$cm^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1302*a* further includes operation 1302*b*. In some embodiments, operation 1302*b* includes forming a first gate region of a first set of transistors.

In some embodiments, operation 1302 further includes operation 1302*c*. In some embodiments, operation 1302*c* includes forming a second gate region of the second set of transistors.

In some embodiments, the first and second gate region is between the drain region and the source region. In some embodiments, the first and second gate region is over the first well and the substrate. In some embodiments, fabricating the first and second gate regions of operations 702*a* and 702*c* include performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the first and second gate regions includes performing one or more deposition processes to form one or more conductive material layers. In some embodiments, fabricating the first and second gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the first and second gate regions include a metal, such as Al, Cu, W, Ti, Ta, TiN, TaN, NiSi, CoSi, other suitable conductive materials, or combinations thereof.

In some embodiments, operation 1302 further includes operation 1302*d*. In some embodiments, operation 1302*d* includes depositing a first conductive material on at least one of a first metal level, a second metal level or a third metal level thereby forming at least one of a corresponding first set of conductors, a second set of conductors or a third set of conductors.

In some embodiments, one or more of operations 1302, 1304, 1306, 1308, 1310 or 1312 or one or more of operations 1302*a*, 1302*b*, 1302*c* or 1302*d* of method 1300 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 14:
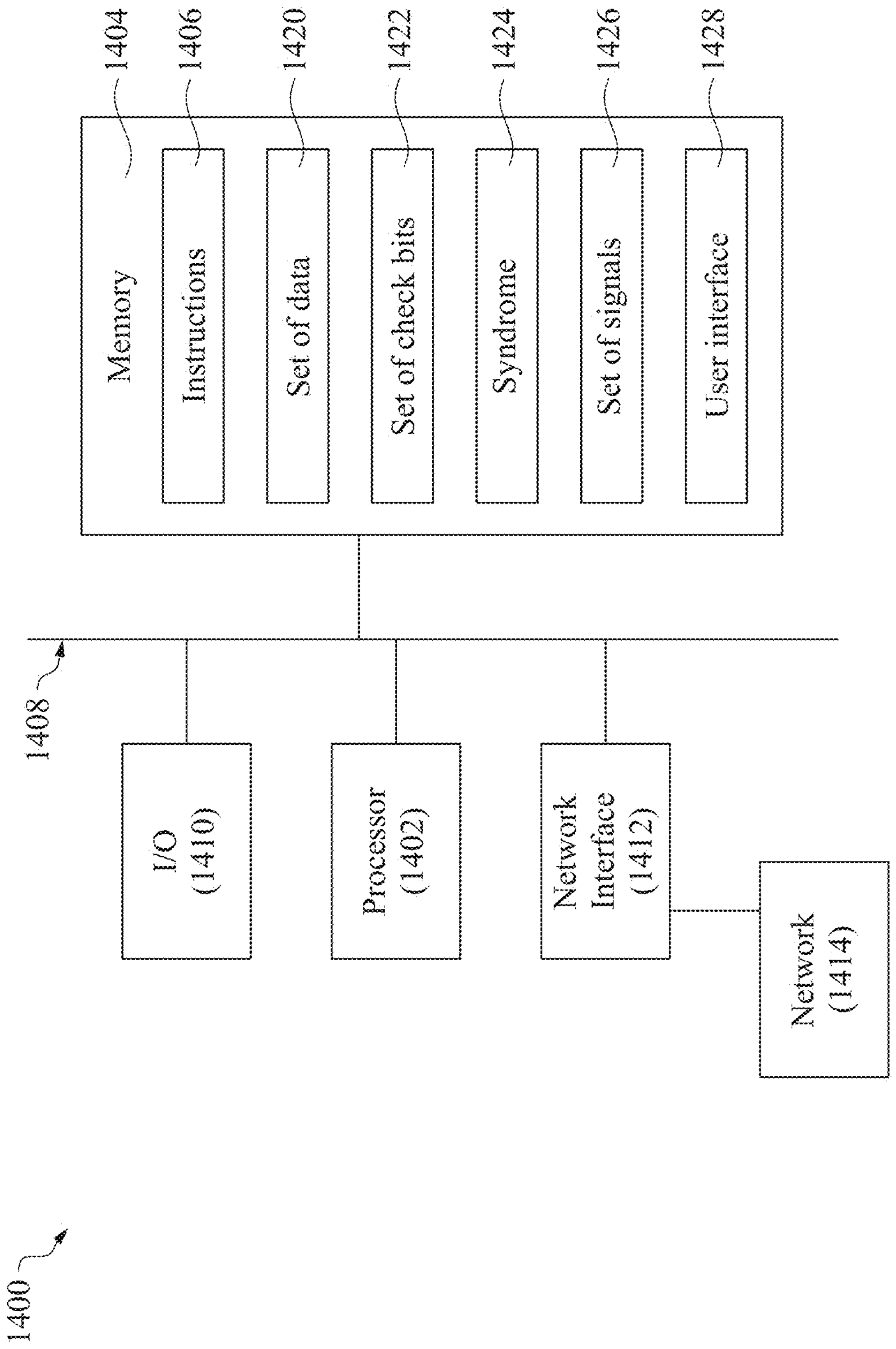
FIG. 14 is a schematic view of a system, in accordance with some embodiments.

FIG. 14 is a schematic view of a system 1400, in accordance with some embodiments. In some embodiments, system 1400 is an embodiment of at least controller 104 of FIG. 1, and similar detailed description is therefore omitted.

In some embodiments, system 1400 is an embodiment of at least one of ECC encoder/decoder 110, first ECC encoder/decoder 110A, second ECC encoder/decoder 110B, ECC encoder/decoder circuit 332*a*, ECC encoder/decoder circuit 332*b*, and similar detailed description is therefore omitted.

In some embodiments, system 1400 is an embodiment of at least one of ECC control circuit 902*a*, ECC control circuit 902*b*, ECC control circuit 904*a*, ECC control circuit 904*b* or set of circuits 1006, and similar detailed description is therefore omitted.

In some embodiments, system 1400 includes one or more of a logic circuit, XOR trees, an ECC encoder, an ECC decoder, a syndrome generator or error logic circuit, and similar detailed description is therefore omitted.

In some embodiments, system 1400 is configured to control one or more of controller 104, memory cell array 102, X-decoder circuit 106, Y-decoder circuit 108, ECC encoder/decoder 110, memory circuit 200, first ECC encoder/decoder 110A, second ECC encoder/decoder 110B, ECC encoder/decoder circuit 332*a*, ECC encoder/decoder circuit 332*b*, ECC control circuit 902*a*, ECC control circuit 902*b*, ECC control circuit 904*a*, ECC control circuit 904*b* or set of circuits 1006. In some embodiments, system 1400 is configured to perform one or more operations described herein including method 1500.

System 1400 includes a hardware processor 1402 and a non-transitory, computer readable storage medium 1404 (e.g., memory 1404) encoded with, i.e., storing, the computer program code 1406, i.e., a set of executable instructions 1406.

Computer readable storage medium 1404 is configured for interfacing with at least one of controller 104, memory cell array 102, X-decoder circuit 106, Y-decoder circuit 108, ECC encoder/decoder 110, memory circuit 200, first ECC encoder/decoder 110A, second ECC encoder/decoder 110B, ECC encoder/decoder circuit 332*a*, ECC encoder/decoder circuit 332*b*, ECC control circuit 902*a*, ECC control circuit 902*b*, ECC control circuit 904*a*, ECC control circuit 904*b* or set of circuits 1006.

The processor 1402 is electrically coupled to the computer readable storage medium 1404 by a bus 1408. The processor 1402 is also electrically coupled to an I/O interface 1410 by bus 1408. A network interface 1412 is also electrically connected to the processor 1402 by bus 1408. Network interface 1412 is connected to a network 1414, so that processor 1402 and computer readable storage medium 1404 are capable of connecting to external elements by network 1414. The processor 1402 is configured to execute the computer program code 1406 (non-transitory instructions) encoded in the computer readable storage medium 1404 in order to cause system 1400 to be usable for performing a portion or all of the operations as described in at least method 1500. In some embodiments, network 1414 is not part of system 1400.

In some embodiments, the processor 1402 is a central processing unit (CPU), a multi-processor, a distributed processing read circuit, an application specific integrated circuit (ASIC), and/or a suitable processing unit.

In some embodiments, the computer readable storage medium 1404 is an electronic, magnetic, optical, electromagnetic, infrared, and/or a semiconductor read circuit (or apparatus or device). For example, the computer readable storage medium 1404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1404 includes a compact disk-read only memory (CD-ROM), a compact disk-read/write (CD-R/W), and/or a digital video disc (DVD).

In some embodiments, the storage medium 1404 stores the computer program code 1406 configured to cause system 1400 to perform one or more operations of at least method 1500. In some embodiments, the storage medium 1404 also stores information used for performing at least method 1500 as well as information generated during performing at least method 1500, such as table 1416, parity check matrix 1418, set of data 1420, set of check bits 1422, syndrome 1424, set of signals 1426 and user interface 1428, and/or a set of executable instructions to perform one or more operations of at least method 1500.

In some embodiments, the storage medium 1404 stores instructions (e.g., computer program code 1406) for interfacing with at least one of controller 104, memory cell array 102, X-decoder circuit 106, Y-decoder circuit 108, ECC encoder/decoder 110, memory circuit 200, first ECC encoder/decoder 110A, second ECC encoder/decoder 110B, ECC encoder/decoder circuit 332*a*, ECC encoder/decoder circuit 332*b*, ECC control circuit 902*a*, ECC control circuit 902*b*, ECC control circuit 904*a*, ECC control circuit 904*b* or set of circuits 1006. The instructions (e.g., computer program code 1406) enable processor 1402 to generate instructions readable by at least one of controller 104, memory cell array 102, X-decoder circuit 106, Y-decoder circuit 108, ECC encoder/decoder 110, memory circuit 200, first ECC encoder/decoder 110A, second ECC encoder/decoder 110B, ECC encoder/decoder circuit 332*a*, ECC encoder/decoder circuit 332*b*, ECC control circuit 902*a*, ECC control circuit 902*b*, ECC control circuit 904*a*, ECC control circuit 904*b* or set of circuits 1006 to effectively implement one or more operations of at least method 1500 during operation of integrated circuit 100, 300, 400A, 400B, 500, 600A, 600B, 700A, 700B, 800A, 800B, 900A, 900B, 1000, 1200A or 1200B.

System 1400 includes I/O interface 1410. I/O interface 1410 is coupled to external circuitry. In some embodiments, I/O interface 1410 includes a keyboard, keypad, mouse, trackball, trackpad, and/or cursor direction keys for communicating information and commands to processor 1402.

System 1400 also includes network interface 1412 coupled to the processor 1402. Network interface 1412 allows system 1400 to communicate with network 1414, to which one or more other computer read circuits are connected. Network interface 1412 includes wireless network interfaces such as BLUETOOTH, WIFI, WIMAX, GPRS, or WCDMA; or wired network interface such as ETHERNET, USB, or IEEE-884. In some embodiments, at least method 1500 is implemented in two or more systems 1400, and information such as table, parity check matrix, set of data, set of check bits, syndrome, set of signals and user interface are exchanged between different systems 1400 by network 1414.

System 1400 is configured to receive information related to a set of data through I/O interface 1410 or network interface 1412. The information is stored in computer readable medium 1404 as set of data 1420. In some embodiments, the set of data includes at least the first set of data D1 or the second set of data D2.

System 1400 is configured to receive information related to a set of check bits through I/O interface 1410 or network interface 1412. The information is stored in computer readable medium 1404 as set of check bits 1422. In some embodiments, the set of check bits includes at least the first set of check bits CB1, the second set of check bits CB2, the third set of check bits CB3 or the fourth set of check bits CB4.

System 1400 is configured to receive information related to a set of data and a set of check bits through I/O interface 1410 or network interface 1412. The information is transferred to processor 1402 by bus 1408 to determine values for generating a syndrome. The syndrome is then stored in computer readable medium 1404 as syndrome 1424. In some embodiments, the syndrome is useable to perform ECC described herein.

System 1400 is configured to receive information related to a set of signals through I/O interface 1410 or network interface 1412. The information is stored in computer readable medium 1404 as set of signals 1426. In some embodiments, the set of signals includes at least one or more the signals described herein.

System 1400 is configured to receive information related to a user interface through I/O interface 1410 or network interface 1412. The information is stored in computer readable medium 1404 as user interface 1428.

FIG. 15 is a flowchart of a method 1500 of operating an integrated circuit, in accordance with some embodiments.

In some embodiments, FIG. 15 is a flowchart of a method of operating one or more of integrated circuit 100, 300, 400A, 400B, 500, 600A, 600B, 700A, 700B, 800A, 800B, 900A, 900B, 1000, 1200A or 1200B, circuit 1100A or 1100B, memory circuit 200, or system 1400 of FIG. 14. It is understood that additional operations may be performed before, during, and/or after the method 1500 depicted in FIG. 15, and that some other operations may only be briefly described herein. In some embodiments, other order of operations of method 1500 is within the scope of the present disclosure. In some embodiments, one or more operations of method 1500 are not performed.

Method 1500 includes exemplary operations, but the operations are not necessarily performed in the order shown. Operations may be added, replaced, changed order, and/or eliminated as appropriate, in accordance with the spirit and scope of disclosed embodiments. It is understood that method 1500 utilizes features of one or more of integrated circuit 100, 300, 400A, 400B, 500, 600A, 600B, 700A, 700B, 800A, 800B, 900A, 900B, 1000, 1200A or 1200B, circuit 1100A or 1100B, memory circuit 200, or system 1400 of FIG. 14.

In operation 1502 of method 1500, a programming operation of a first set of memory cells is performed.

In some embodiments, the first set of memory cells of method 1500 includes at least one of the first set of memory cells of method 1300 includes at least one of memory cell array 301*a*, 401*a*1, 401*a*2, 501*a*, 601*a*1, 601*a*2 or 801*a*1 or the second set of memory cells of method 1300 includes at least one of memory cell array 301*b*, 401*b*1, 401*b*2, 501*b*, 601*b*1, 601*b*2 or 801*b*1.

In some embodiments, operation 1502 is performed by at least one of X-decoder circuit 106, or Y-decoder circuit 108.

In some embodiments, operation 1502 includes one or more of operations 1504, 1506 or 1508.

In some embodiments, the first set of memory cells of method 1500 includes at least one of a first set of memory cells, and a second set of memory cells.

In operation 1504 of method 1500, a first set of data is stored in a first set of memory cells, and a second set of data is stored in a second set of memory cells.

In some embodiments, the first set of memory cells of method 1500 includes at least one of memory cell array 301*a*, 401*a*1, 401*a*2, 501*a*, 601*a*1, 601*a*2 or 801*a*1. In some embodiments, the first set of memory cells of method 1500 includes at least the first set of memory cells 102A.

In some embodiments, the second set of memory cells of method 1500 includes at least one of memory cell array 301*b*, 401*b*1, 401*b*2, 501*b*, 601*b*1, 601*b*2 or 801*b*1.

In some embodiments, the second set of memory cells of method 1500 includes at least the second set of memory cells 102B.

In some embodiments, operation 1504 is performed by at least one of X-decoder circuit 106, or Y-decoder circuit 108.

In operation 1506 of method 1500, a first set of check bits is generated in response to the first set of data, and a second set of check bits is generated in response to the first set of check bits.

In some embodiments, the first set of check bits of method 1500 includes at least the first set of check bits CB1 or the third set of check bits CB3.

In some embodiments, the second set of check bits of method 1500 includes at least the second set of check bits CB2 or the fourth set of check bits CB4.

In some embodiments, operation 1506 is performed by ECC encoder/decoder 110, first ECC encoder/decoder 110A, second ECC encoder/decoder 110B, control circuit 332, ECC encoder/decoder circuit 332*a*, ECC encoder/decoder circuit 332*b*, ECC control circuit 902*a*, 902*b*, 904*a* or 904*b*, set of circuits 1006 or system 1400.

In operation 1508 of method 1500, the first set of check bits is stored in a first ECC memory cell array, and the second set of check bits is stored in a second ECC memory cell array.

In some embodiments, the first ECC memory cell array of method 1500 includes at least one of ECC memory cell array 306, 406*a*, 406*b*, 506, 606*a*, 606*b*, 806*a* or 1004 or at least one of integrated circuit 1100A, 1100B, 1200A or 1200B.

In some embodiments, the second memory cell array of method 1500 includes at least one of memory cell array 304, 404*a*, 404*b*, 804*a* or 1002 or at least one of integrated circuit 1100A, 1100B, 1200A or 1200B.

In some embodiments, operation 1508 is performed by at least one of X-decoder circuit 106, or Y-decoder circuit 108.

In operation 1510 of method 1500, a read operation of the first set of memory cells is performed.

In some embodiments, operation 1510 is performed by at least one of the set of IO circuits 310*a*, 410*a*, 510*a* or 610*a* or the set of IO circuits 310*b*, 410*b*, 510*b* or 610*b*.

In some embodiments, operation 1510 includes one or more of operations 1512 or 1514.

In operation 1512 of method 1500, the first set of data is read from the first set of memory cells, and the second set of data is read from the second set of memory cells.

In some embodiments, operation 1512 is performed by at least one of the set of sense amplifiers 312 or 412 or the set of sense amplifiers 314 or 414.

In operation 1514 of method 1500, the first set of check bits is read from the first ECC memory cell array, and the second set of check bits is read from the second ECC memory cell array.

In some embodiments, operation 1516 is performed by at least one of the first set of ECC sense amplifiers 316, 416, 516 or 616, or the second set of ECC sense amplifiers 318, 418, 518 or 618.

In operation 1516 of method 1500, a determination is made whether data read from the first memory cell array or second memory cell array contains an error based on the first set of check bits or the second set of check bits.

In some embodiments, operation 1516 is performed by at least one of controller 104, ECC encoder/decoder 110, first ECC encoder/decoder 110A, second ECC encoder/decoder 110B, control circuit 332, ECC encoder/decoder circuit 332*a*, ECC encoder/decoder circuit 332*b*, ECC control circuit 902*a*, 902*b*, 904*a* or 904*b*, set of circuits 1006 or system 1400.

In some embodiments, the determination of operation 1516 is performed by at least one of controller 104, ECC encoder/decoder 110, first ECC encoder/decoder 110A, second ECC encoder/decoder 110B, control circuit 332, ECC encoder/decoder circuit 332*a*, ECC encoder/decoder circuit 332*b*, ECC control circuit 902*a*, 902*b*, 904*a* or 904*b*, set of circuits 1006 or system 1400.

In some embodiments, operation 1516 includes generating a syndrome, and using the syndrome to determine whether data read from the first memory cell array or second memory cell array contains an error.

In some embodiments, if the determination of operation 1516 is a "no", and method 1500 proceeds to operation 1518.

In some embodiments, if the determination of operation 1516 is a "yes", and method 1500 proceeds to operation 1520.

In operation 1518 of method 1500, method 1500 remains in an idle state until another read or programming operation.

In operation 1520 of method 1500, the data read from the first or second memory cell array is corrected based on the ECC.

In some embodiments, operation 1520 is performed by at least one of controller 104, ECC encoder/decoder 110, first ECC encoder/decoder 110A, second ECC encoder/decoder 110B, control circuit 332, ECC encoder/decoder circuit 332*a*, ECC encoder/decoder circuit 332*b*, ECC control circuit 902*a*, 902*b*, 904*a* or 904*b*, set of circuits 1006 or system 1400.

By operating at least method 1500, the integrated circuit operates to achieve the benefits discussed herein.

In some embodiments, at least a portion of method 1500 is implemented as a standalone software application for execution by a processor. In some embodiments, at least a portion of method 1500 is implemented as a software application that is a part of an additional software application. In some embodiments, at least a portion of method 1500 is implemented as a plug-in to a software application. In some embodiments, at least a portion of method 1500 is implemented as a software application that is a portion of an ECC tool. In some embodiments, at least a portion of method 1500 is implemented as a software application that is used by an ECC tool.

In some embodiments, one or more of the operations of method 1500 is not performed. Furthermore, various logic circuits shown in FIGS. 1-15 are for illustration purposes. Embodiments of the disclosure are not limited to a particular logic circuits, and one or more of the logic circuits shown in FIGS. 1-15 can be substituted with a one or more corresponding logic circuits of a different function or an equivalent function. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of logic circuits in FIGS. 1-15 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to an integrated circuit. The integrated circuit includes a first set of memory cells configured to store a first set of data, a second set of memory cells configured to store a second set of data, a first set of input output (IO) circuits coupled to the first set of memory cells, a second set of IO circuits coupled to the second set of memory cells, a first error correction code (ECC) circuit configured to store a first number of ECC bits, a second ECC circuit configured to store a second number of ECC bits; and a first ECC encoder/decoder circuit configured to correct at least a first number of errors in the first set of data and the second set of data based on the first number of ECC bits and the second number of ECC bits.

Another aspect of this description relates an integrated circuit. The integrated circuit includes a first memory cell array, a second memory cell array, a control circuit coupled to the first memory cell array and the second memory cell array, a first set of sense amplifiers coupled to the first memory cell array, a second set of sense amplifiers coupled to the second memory cell array, a first error correction code (ECC) circuit configured to store a first set of ECC check bits, a second ECC circuit configured to store a second set of ECC check bits, a first ECC encoder/decoder circuit configured to generate the first set of ECC check bits based on a first set of data stored in the first memory cell array, and a second ECC encoder/decoder circuit configured to generate the second set of ECC check bits based on a second set of data stored in the second memory cell array. In some embodiments, the first ECC circuit and the second ECC circuit are configured to correct at least a first number of errors in the first set of data and the second set of data based on the first set of ECC check bits and the second set of ECC check bits.

Still another aspect of this description relates to a method of fabricating an integrated circuit. In some embodiments, the method includes fabricating a first set of memory cells in a substrate, the first set of memory cells including a first memory cell array and a first ECC memory cell array. In some embodiments, the method further includes fabricating a second set of memory cells in the substrate, the second set of memory cells including a second memory cell array and a second ECC memory cell array. In some embodiments, the method further includes fabricating a word line driver circuit in the substrate, the word line driver circuit being between the first set of memory cells and the second set of memory cells. In some embodiments, the method further includes fabricating a first set of input/output (IO) circuits in the substrate, the first set of IO circuits including a first set of sense amplifiers and a first set of error correction code (ECC) sense amplifiers. In some embodiments, the method further includes fabricating a second set of IO circuits in the substrate, the second set of IO circuits including a second set of sense amplifiers and a second set of ECC sense amplifiers. In some embodiments, the method further includes fabricating a control circuit in the substrate, the control circuit including a first ECC encoder/decoder circuit and a second ECC encoder/decoder circuit, the first ECC encoder/decoder circuit and the second ECC encoder/decoder circuit being between the first set of IO circuits and the second set of IO circuits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:

a first set of memory cells configured to store a first set of data;

a second set of memory cells configured to store a second set of data;

a first set of input output (IO) circuits coupled to the first set of memory cells;

a second set of IO circuits coupled to the second set of memory cells;

a first error correction code (ECC) circuit configured to store a first number of ECC bits;

a second ECC circuit configured to store a second number of ECC bits; and a first ECC encoder/decoder circuit configured to correct at least a first number of errors in the first set of data and the second set of data based on the first number of ECC bits and the second number of ECC bits, wherein the first ECC circuit comprises:

a first ECC memory cell array;

a second ECC memory cell array;

a third ECC memory cell array;

a first sense amplifier coupled to the first ECC memory cell array;

a second sense amplifier coupled to the second ECC memory cell array; and a third sense amplifier coupled to the third ECC memory cell array.

2. The integrated circuit of claim 1, wherein the second ECC circuit comprises:

a fourth ECC memory cell array;

a fifth ECC memory cell array;

a sixth ECC memory cell array;

a fourth sense amplifier coupled to the fourth ECC memory cell array;

a fifth sense amplifier coupled to the fifth ECC memory cell array; and a sixth sense amplifier coupled to the sixth ECC memory cell array.

3. The integrated circuit of claim 2, wherein the first ECC circuit further comprises:

a seventh ECC memory cell array;

an eighth ECC memory cell array;

a ninth ECC memory cell array;

a seventh sense amplifier coupled to the seventh ECC memory cell array;

an eighth sense amplifier coupled to the eighth ECC memory cell array; and a ninth sense amplifier coupled to the ninth ECC memory cell array.

4. The integrated circuit of claim 3, wherein the second ECC circuit further comprises:

a tenth ECC memory cell array;

an eleventh ECC memory cell array;

a twelfth ECC memory cell array;

a tenth sense amplifier coupled to the tenth ECC memory cell array;

an eleventh sense amplifier coupled to the eleventh ECC memory cell array; and a twelfth sense amplifier coupled to the twelfth ECC memory cell array.

5. The integrated circuit of claim 1, wherein the first number of ECC bits is 3 bits;

the second number of ECC bits is 3 bits; and the first number of errors is 1 bit.

6. The integrated circuit of claim 1, wherein the first number of ECC bits is 3 bits;

the second number of ECC bits is 6 bits; and the first number of errors is 1 bit.

7. The integrated circuit of claim 1, wherein the first number of ECC bits is 6 bits;

the second number of ECC bits is 6 bits; and the first number of errors is 2 bits.

8. An integrated circuit, comprising:

a first memory cell array;

a second memory cell array;

a control circuit coupled to the first memory cell array and the second memory cell array;

a first set of sense amplifiers coupled to the first memory cell array;

a second set of sense amplifiers coupled to the second memory cell array;

a first error correction code (ECC) circuit configured to store a first set of ECC check bits;

a second ECC circuit configured to store a second set of ECC check bits;

a first ECC encoder/decoder circuit configured to generate the first set of ECC check bits based on a first set of data stored in the first memory cell array; and a second ECC encoder/decoder circuit configured to generate the second set of ECC check bits based on a second set of data stored in the second memory cell array, wherein the first ECC circuit and the second ECC circuit are configured to correct at least a first number of errors in the first set of data and the second set of data based on the first set of ECC check bits and the second set of ECC check bits;

wherein the first ECC circuit comprises:

a first ECC memory cell array;

a second ECC memory cell array;

a third ECC memory cell array;

a first sense amplifier coupled to the first ECC memory cell array;

a second sense amplifier coupled to the second ECC memory cell array; and a third sense amplifier coupled to the third ECC memory cell array.

9. The integrated circuit of claim 8, wherein the second ECC circuit comprises:

a fourth ECC memory cell array;

a fifth ECC memory cell array;

a sixth ECC memory cell array;

a fourth sense amplifier coupled to the fourth ECC memory cell array;

a fifth sense amplifier coupled to the fifth ECC memory cell array; and a sixth sense amplifier coupled to the sixth ECC memory cell array.

10. The integrated circuit of claim 9, wherein the first ECC memory cell array, the second ECC memory cell array and the third ECC memory cell array are part of the first memory cell array; and the fourth ECC memory cell array, the fifth ECC memory cell array and the sixth ECC memory cell array are part of the second memory cell array.

11. The integrated circuit of claim 10, wherein the first sense amplifier, the second sense amplifier and the third sense amplifier are part of the first set of sense amplifiers; and the fourth sense amplifier, the fifth sense amplifier and the sixth sense amplifier are part of the second set of sense amplifiers.

12. The integrated circuit of claim 11, wherein the first memory cell array includes a first end and a second end opposite from the first end;

the second memory cell array includes a third end and a fourth end opposite from the third end;

the first ECC memory cell array, the second ECC memory cell array and the third ECC memory cell array are positioned on the first end of the first memory cell array; and the fourth ECC memory cell array, the fifth ECC memory cell array and the sixth ECC memory cell array are positioned on the third end of the second memory cell array.

13. The integrated circuit of claim 12, wherein the first end of the first memory cell array is adjacent to the third end of the second memory cell array.

14. The integrated circuit of claim 12, wherein the first end of the first memory cell array is adjacent to the fourth end of the second memory cell array.

15. The integrated circuit of claim 12, wherein the second end of the first memory cell array is adjacent to the fourth end of the second memory cell array.

16. The integrated circuit of claim 9, wherein the first ECC memory cell array, the second ECC memory cell array and the third ECC memory cell array are separated from the first memory cell array in a first direction by a first distance; and the fourth ECC memory cell array, the fifth ECC memory cell array and the sixth ECC memory cell array are separated from the second memory cell array in the first direction by a second distance.

17. The integrated circuit of claim 9, wherein the first memory cell array, the second memory cell array, the first ECC memory cell array, the second ECC memory cell array, the third ECC memory cell array, the fourth ECC memory cell array, the fifth ECC memory cell array and the sixth ECC memory cell array includes one-time programmable memory.

18. The integrated circuit of claim 8, wherein the first set of ECC check bits includes 3 bits;

the second set of ECC check bits includes 3 bits; and the first number of errors is 1 bit.

19. The integrated circuit of claim 8, wherein the first set of ECC bits includes 3 bits;

the second set of ECC bits includes 6 bits; and the first number of errors is 1 bit.

20. A method of operating an integrated circuit, the method comprising:

performing a programming operation of a first set of memory cells, the performing the programming operation of the first set of memory cells comprising:

storing a first set of data in a first memory cell array and a second set of data in a second memory cell array;

generating a first set of check bits in response to the first set of data and a second set of check bits in response to the second set of data; and storing the first set of check bits in a first ECC memory cell array, and the second set of check bits in a second ECC memory cell array, the first ECC memory cell array and the second ECC memory cell array being part of a first ECC circuit;

performing a read operation of the first set of memory cells; and correcting read data from the first or second memory cell array in response to determining that data read from the first or second memory cell array contains an error based on the first set of check bits and the second set of check bits;

wherein the first ECC circuit comprises:

the first ECC memory cell array;

the second ECC memory cell array;

a third ECC memory cell array;

a first sense amplifier coupled to the first ECC memory cell array;

a second sense amplifier coupled to the second ECC memory cell array; and a third sense amplifier coupled to the third ECC memory cell array.

* * * * *